United States Patent
Lee et al.

(10) Patent No.: US 12,520,439 B2
(45) Date of Patent: Jan. 6, 2026

(54) DISPLAY DEVICE

(71) Applicants: Samsung Display Co., LTD., Yongin-si (KR); AUFLEX Co., Ltd., Hwaseong-si (KR)

(72) Inventors: Junghun Lee, Yongin-si (KR); Yoon-Je Woo, Hwaseong-si (KR); Dong-Jin Kim, Hwaseong-si (KR); Sungsang Ahn, Yongin-si (KR); Taehoon Yang, Yongin-si (KR)

(73) Assignees: SAMSUNG DISPLAY CO., LTD., Gyeonggi-Do (KR); AUFLEX CO., LTD., Gyeonggi-Do (KR)

( * ) Notice: Subject to any disclaimer, the term of this patent is extended or adjusted under 35 U.S.C. 154(b) by 217 days.

(21) Appl. No.: 18/239,966

(22) Filed: Aug. 30, 2023

(65) Prior Publication Data
US 2024/0215181 A1 Jun. 27, 2024

(30) Foreign Application Priority Data
Dec. 22, 2022 (KR) .................. 10-2022-0182118

(51) Int. Cl.
*H05K 5/02* (2006.01)
*H10K 59/12* (2023.01)
*H10K 102/00* (2023.01)

(52) U.S. Cl.
CPC .......... *H05K 5/0217* (2013.01); *H10K 59/12* (2023.02); *H10K 2102/311* (2023.02)

(58) Field of Classification Search
CPC .................. H05K 5/0017; H05K 5/0217
USPC ..................................... 361/807, 809, 810
See application file for complete search history.

(56) References Cited

U.S. PATENT DOCUMENTS

| 7,636,085 | B2 | 12/2009 | Yang | |
|---|---|---|---|---|
| 2019/0196548 | A1* | 6/2019 | Kim | G06F 1/1681 |
| 2021/0325929 | A1* | 10/2021 | Cai | B32B 3/04 |
| 2022/0167512 | A1* | 5/2022 | Ahn | G06F 1/1624 |
| 2022/0404867 | A1* | 12/2022 | Shin | G06F 1/1681 |

FOREIGN PATENT DOCUMENTS

| CN | 113257123 A | * | 8/2021 | ............ G09F 9/301 |
|---|---|---|---|---|
| KR | 100781708 B1 | | 12/2007 | |
| KR | 102393810 | * | 5/2022 | ............... G09F 9/30 |

* cited by examiner

*Primary Examiner* — Hung S. Bui
(74) *Attorney, Agent, or Firm* — CANTOR COLBURN LLP

(57) ABSTRACT

A display device includes: a display module; a first support plate disposed under the display module, and including a first flat part and a ductile part, where the ductile part extends from the first flat part in a first direction and has a plurality of openings defined therein; a second support plate including a second flat part disposed under the first flat part and a plurality of supporting bars disposed under the ductile part and arranged in the first direction; and a resin layer disposed between the first support plate and the second support plate.

22 Claims, 26 Drawing Sheets

DISPLAY DEVICE

This application claims priority to Korean Patent Application No. 10-2022-0182118, filed on Dec. 22, 2022, and all the benefits accruing therefrom under 35 U.S.C. § 119, the content of which in its entirety is herein incorporated by reference.

BACKGROUND

The present disclosure herein relates to a display device.

In general, an electronic apparatus, which provides users with images, such as a smart phone, a digital camera, a laptop computer, a navigation system, and a smart television, includes a display device for displaying images. The display device generates images and provides the images to users through a display screen.

With the technological development of the display device, various shapes of the display device are being developed. For example, a flexible display device, etc., which is slid or wound to be expandable toward the outside of a case is being developed. The flexible display device, which may be deformed into various shapes, is easy to carry and may improve a user's convenience.

The display device includes a display module. Under the display module, a plurality of supporting plates are disposed. There is a need for development of a structure in which the support plates are not separated from each other when a display device contracts or expands.

SUMMARY

The present disclosure provides a display device in which when the display device contracts or expands, support plates disposed under a display module are strongly bonded together and the support plates are not separated from each other.

An embodiment of the invention provides a display device including: a display module; a first support plate disposed under the display module, and including a first flat part and a ductile part, where the ductile part extends from the first flat part in a first direction and has a plurality of openings defined therein: a second support plate including a second flat part disposed under the first flat part and a plurality of support bars disposed under the ductile part and arranged in the first direction; and resin layers disposed between the first support plate and the second support plate.

In an embodiment of the invention, a plurality of grooves may be defined in a lower surface of the ductile part or upper surfaces of the support bars.

In an embodiment of the invention, a display device includes: a display module: a first support plate disposed under the display module: a second support plate disposed under the first support plate, and including a flat part and a plurality of support bars arranged from the flat part in the first direction; and a resin layer disposed between the first support plate and the second support plate. A plurality of grooves are defined in upper surfaces of the support bars, and the resin layer fills the grooves.

In an embodiment of the invention, a display device includes: a display module: a first support plate disposed under the display module, and including a first flat part and a ductile part, where the ductile part extends from the first flat part and has a plurality of openings defined therein: and a second support plate including a second flat part disposed under the first flat part and a plurality of support bars disposed under the ductile part and arranged in a first direction. A plurality of grooves are defined in a lower surface of the ductile part and upper surfaces of the support bars.

BRIEF DESCRIPTION OF THE FIGURES

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
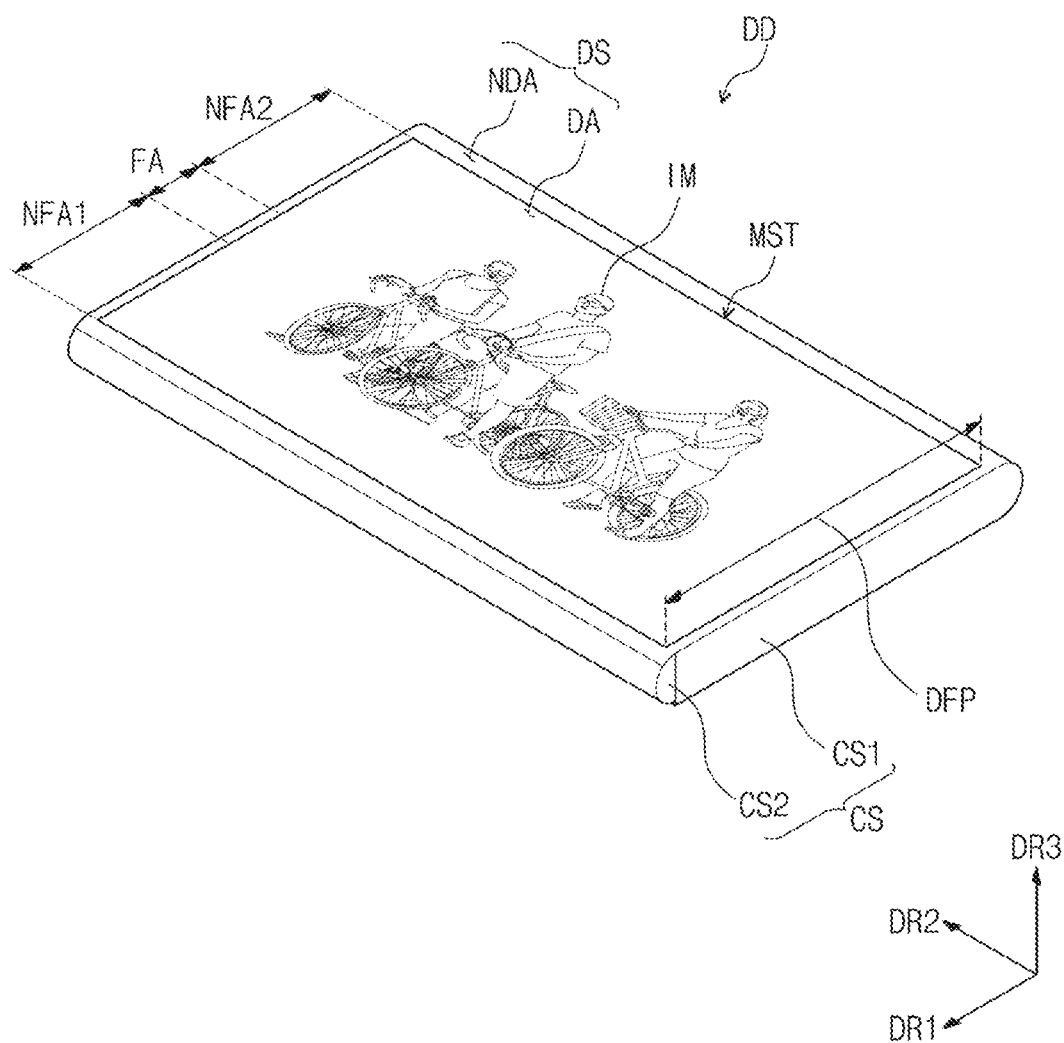
FIG. 1 is a perspective view of a display device according to an embodiment of the invention.

Advantages and features of the invention, and a method for achieving the same will become clear with reference to embodiments described below in detail in conjunction with the accompanying drawings. The invention is not limited to the embodiments disclosed hereinafter, but may be implemented in a variety of different forms, the present embodiments are provided to make the disclosure of the invention complete, fully informing one of ordinary skill in the art to which the invention belongs about the scope of the invention, and the invention is defined only by the scope of the claims. Like reference numerals or symbols refer to like elements throughout the specification.

When an element or layer is referred to as being "on" another element or layer, it refers both being directly on the other element or layer or having intervening elements or layers therebetween. In contrast, when an element is referred to as being "directly on" another element or layer, there are no intervening elements or layers present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes all combinations of one or more of the mentioned items.

Spatially relative terms, such as "below", "beneath", "lower", "above", "upper" and the like, may be used herein for ease of description to describe one element or component's relationship to another element(s) or component(s) as illustrated in the figures. It will be understood that the spatially relative terms are intended to encompass different orientations of the device in use or operation in addition to the orientation depicted in the figures. Like reference numerals or symbols refer to like elements throughout the specification.

Although the terms "first", "second", etc. may be used herein to describe various elements, components, regions and/or sections, these elements, components, regions and/or sections should not be limited by these terms. These terms are only used to distinguish one element, component, region or section from another region or section. Thus, a first element, component, region or section discussed below could be termed a second element, component, region or section without departing from the teachings of the present invention.

The embodiments described herein will be explained with reference to a plan view and a cross-sectional view which are ideal schematic diagrams of the present invention. Therefore, a shape of embodiments may be modified due to manufacturing techniques and/or tolerances. Therefore, the embodiments of the present invention are not limited to certain forms that are illustrated, and include changes in shapes that occur in a manufacturing process. Therefore, regions that are illustrated in the views have schematic properties, a shape of regions that are illustrated in the views is for illustrating a certain shape of regions of elements, and is not for limiting the scope of the present invention.

Hereinafter, the embodiments of the invention will be described in detail with reference to the accompanying drawings.

Figure 2:
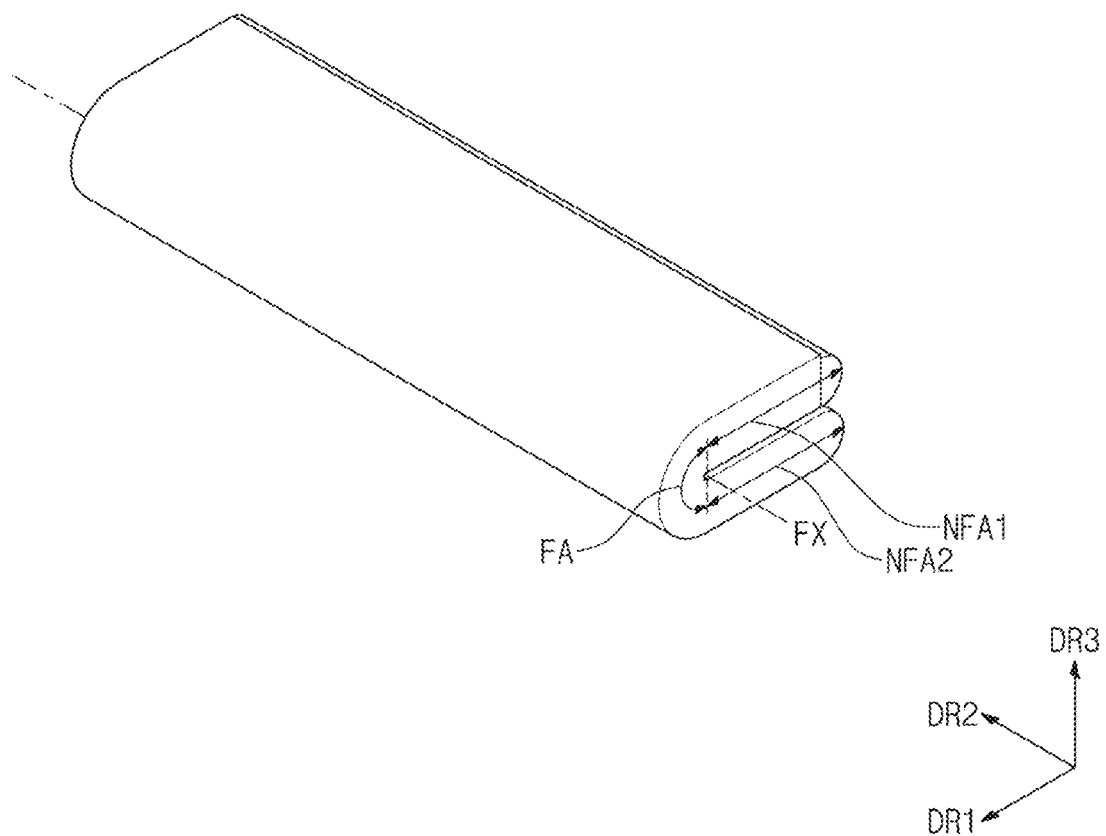
FIG. 2 is a view illustrating that the display device illustrated in FIG. 1 is in a folding state.
Figure 3:
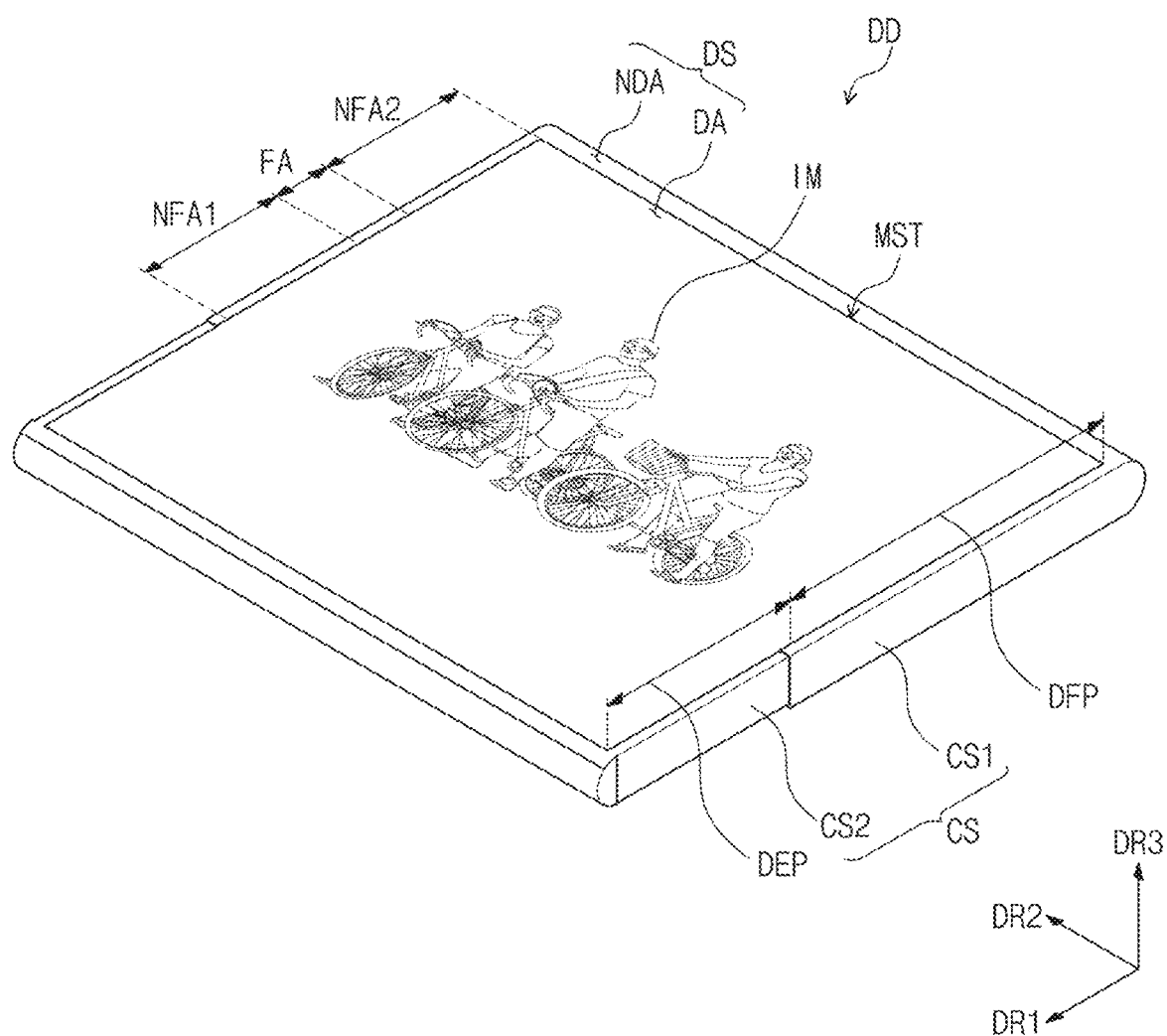
FIG. 3 is a view for describing an extension mode of the display device illustrated in FIG. 1.
Figure 4:
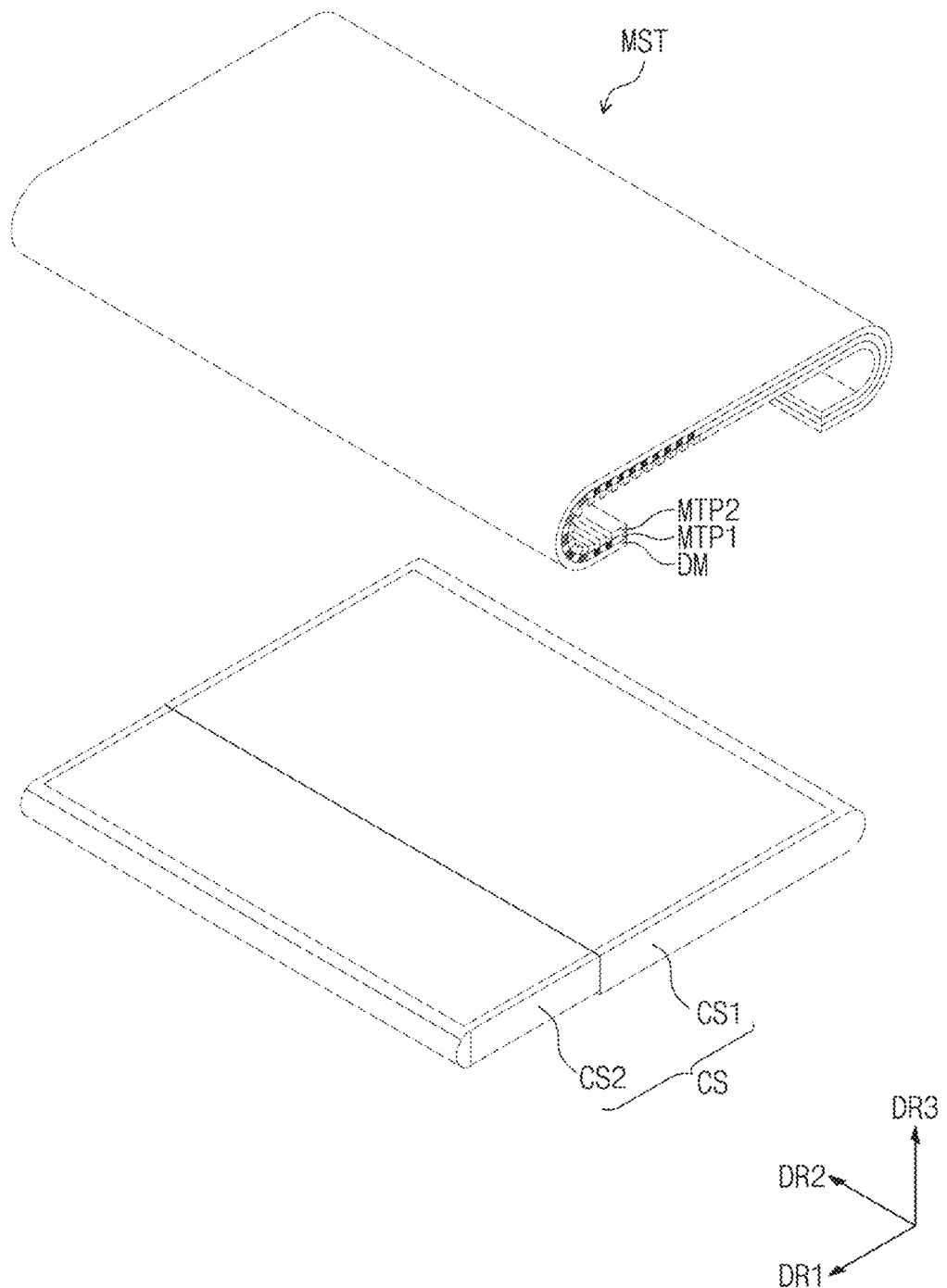
FIG. 4 is an exploded perspective view of the display device illustrated in FIGS. 1 to 3.
Figure 5A:
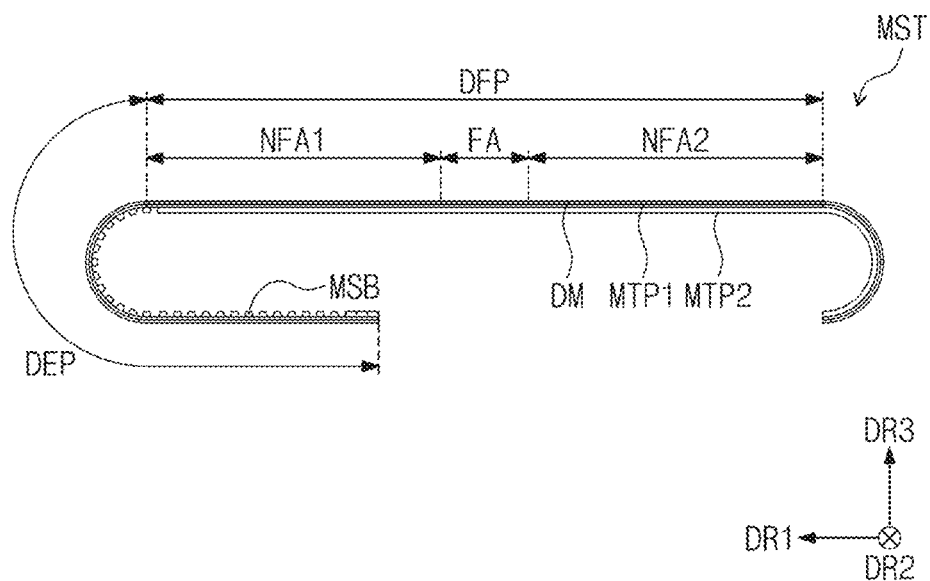
FIGS. 5A and 5B are views for describing a contraction mode and an extension mode of a module set illustrated in FIG. 4.
Figure 5B:
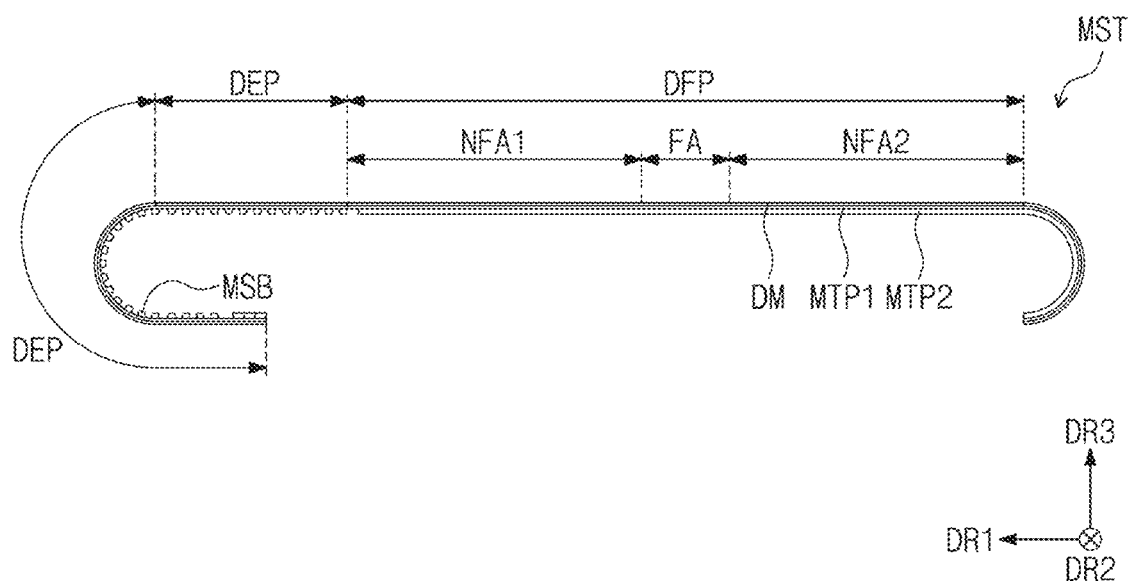

FIG. 1 is a perspective view of a display device according to an embodiment of the invention. FIG. 2 is a view illustrating that the display device illustrated in FIG. 1 is in a folding state. FIG. 3 is a view for describing an extension mode of the display device illustrated in FIG. 1. FIG. 4 is an exploded perspective view of the display device illustrated in FIGS. 1 to 3. FIGS. 5A and 5B are views for describing a contraction mode and an extension mode of the module set illustrated in FIG. 4.

For example, FIGS. 5A and 5B are side views seen from a second direction DR2.

Referring to FIGS. 1 and 2, a display device DD may have a rectangular shape having short sides extending in a first direction DR1 and long sides extending in the second direction DR2 crossing the first direction DR1. However, an embodiment of the invention is not limited thereto, and the display device DD may have various shapes such as a circle and a polygon. The display device DD may be a flexible display device.

Hereinafter, a direction crossing the first direction DR1 is defined as the second direction DR2. A direction crossing substantially perpendicular to a plane defined by the first and second directions DR1, DR2 is defined as a third direction DR3. In this specification, the term "when viewed on a plane" may mean a state of being viewed in the third direction DR3.

The display device DD may include a folding region FA and a plurality of non-folding regions NFA1, NFA2. The non-folding regions NFA1, NFA2 may include a first non-folding region NFA1, and a second non-folding region NFA2. The folding region FA may be disposed between the first non-folding region NFA1 and the second non-folding region NFA2. The second non-folding region NFA2, the folding region FA, and the first non-folding region NFA1 may be arranged in the first direction DR1 in this order.

Although one folding region FA and two non-folding regions NFA1, NF A2 are exemplarily illustrated, the numbers of the folding region FA and the non-folding regions NFA1, NFA2 are not limited thereto. For another example, the display device DD may include a plurality of non-folding regions, the number of which is greater than two, and a plurality of folding regions disposed between the plurality of the non-folding regions.

An upper surface of the display device DD may be defined as a display surface DS, and the display surface DS may have a flat surface defined by the first direction DR1 and the second direction DR2. Through the display surface DS, images IM generated by the display device DD may be provided to users.

The display surface DS may include a display region DA and a non-display region NDA around the display region DA. The display region DA may display an image, and the non-display region NDA may not display an image. The non-display region NDA may surround the display region DA and may define an edge of the display device DD, which is printed with a predetermined color.

Referring to FIG. 2, the display device DD may be folded or unfolded. In an embodiment, for example, the folding region FA may be bent with respect to a folding axis FX parallel to the second direction DR2, and the display device DD may be folded. The folding axes FX may be defined as a long axis parallel to the long sides of the display device DD.

When the display device DD is folded, the display device DD may be in-folded such that the first non-folding region NFA1 and the second non-folding region NFA2 may face each other and the display surface DS is not exposed to an outside. However, an embodiment of the invention is not limited thereto.

Referring to FIG. 3, the display device DD may include a module set MST and a case CS. The case CS may accommodate the module set MST. Opposite sides of the case CS, which are opposed to each other in the first direction DR1, may each have a curved shape.

The case CS may include a first case CS1 and a second case CS2. The second case CS2 may move along the first direction DR1 so as to be far away from the first case CS1 or close to the first case CS1.

The module set MST may be accommodated in the case CS and may display the images IM. One side of opposite sides of the module set MST, which are opposed to each other in the first direction DR1, may be accommodated in the first case CS1. The other side of the module set MST may be accommodated in the second case CS2. Accordingly, when the second case CS2 moves away from the first case CS1 along the first direction DR1, more part of the module set MST may be unfolded in the first direction DR1. When the second case CS2 moves in the first direction DR1, an area of an exposed surface of the module set MST may be adjusted according to a movement of the second case CS2. According to the movement of the second case CS2, the contraction mode and extension mode of the display device DD may be implemented.

Referring to FIGS. 4, 5A and 5B, the module set MST may include a display module DM, a first support plate MTP1, and a second support plate MTP2. The display module DM may be a flexible display module. The display module DM may include a stationary region DFP and an extendable region DEP. When the display device DD is in the contraction mode, a portion of the display module DM, which is exposed flat to the outside, may be defined as the stationary region DFP and a portion of the display module DM, which is not exposed flat to the outside, may be defined as an extendable region DEP.

When the display module DM is in the extension mode, a part of the extendable region DEP may be exposed flat to the outside. The extendable region DEP may extend from the stationary region DFP in the first direction DR1. As illustrated in FIG. 5B, when in the extension mode, the stationary region DFP and extendable region DEP may be arranged in the first direction DR1 in this order. When the display device DD is in the contraction mode, the extendable region DEP may be disposed under the stationary region DFP, as illustrated in FIG. 5A.

The display module DM may be supported by the first support plate MTP1 and the second support plate MTP2 disposed under the display module DM. The first support plate MTP1 may be disposed between a display panel DP and the second support plate MTP2. The second support plate MTP2 may be disposed under the first support plate MTP1 and bonded thereto. A bonding relationship between the first support plate MTP1 and the second support plate MTP2 will be described in detail with reference to FIG. 17.

Figure 6:
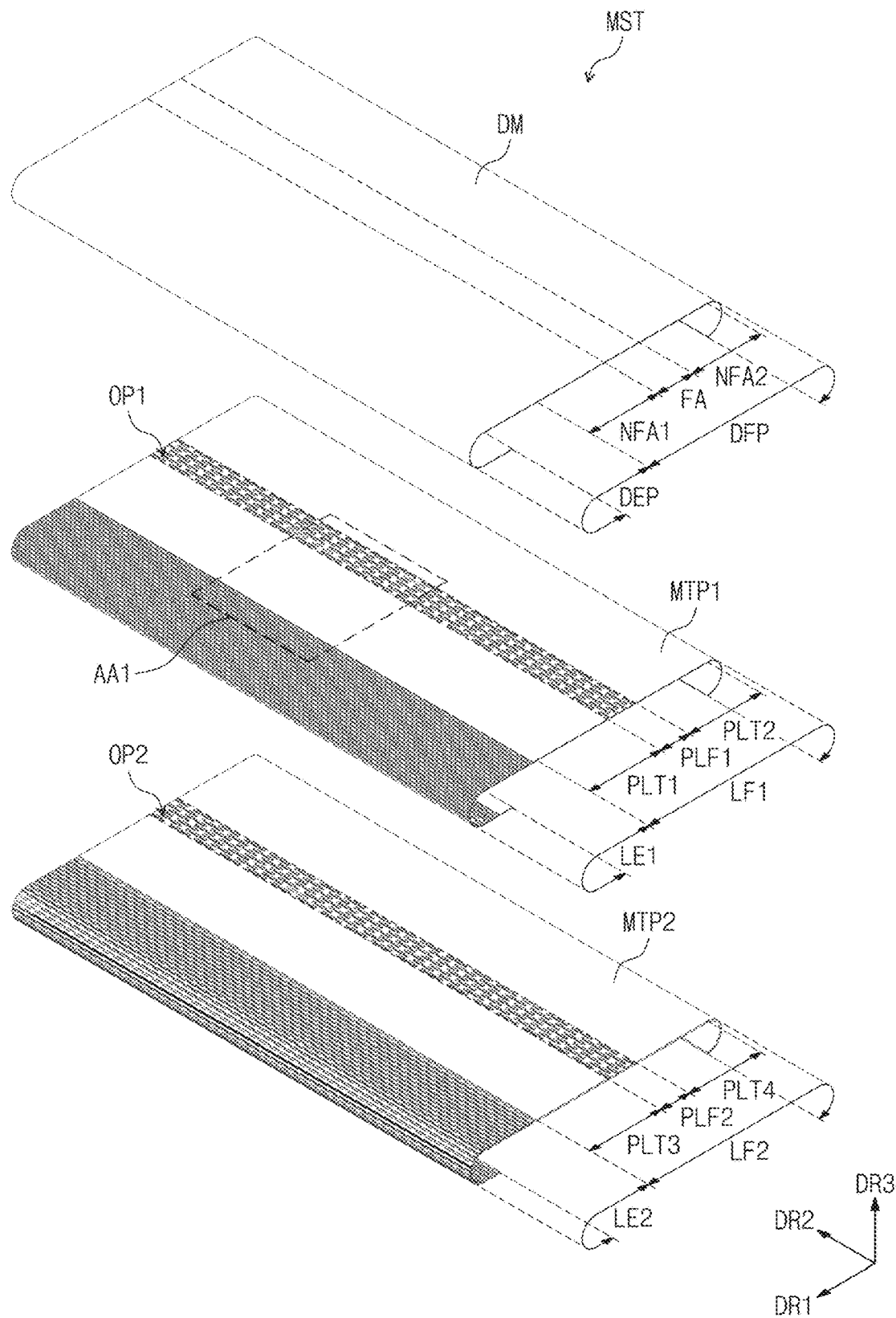
FIG. 6 is an exploded perspective view of the module set illustrated in FIG. 4.

FIG. 6 is an exploded perspective view of the module set illustrated in FIG. 4.

Opposite sides of the display module DM, which are opposed to each other in the first direction DR1, may each have a curved shape. Although not illustrated, when the display module DM is unfolded, the display module DM may have a rectangular shape having short sides extending in the first direction DR1 and long sides extending in the second direction DR2.

The first support plate MTP1 may be disposed under the display module DM. An upper surface of the first support plate MTP1 may be attached to a lower surface of the display module DM.

The first support plate MTP1 may include a first stationary part LF1 and a first extendable part LE1. The first stationary part LF1 may overlap the stationary region DFP of the display module DM. The first extendable part LE1 may overlap the extendable region DEP. The first extendable part LE1 may extend from the first stationary part LF1.

The first stationary part LF1 may include a first flat surface PLT1, a first folding part PLF1, and a second flat surface PLT2. The first flat surface PLT1, the first folding part PLF1, and the second flat surface PLT2 may be arranged in the direction opposite to the first direction DR1 in this order. The first folding part PLF1 may extend from the first flat surface PLT1 in a direction opposite to the first direction DR1. The second flat surface PLT2 may extend from the first folding part PLF1 in the direction opposite to the first direction DR1. The first flat surface PLT1, the first folding part PLF1, and the second flat surface PLT2 may be formed integrally. The first folding part PLF1 may be disposed between the first flat surface PLT1 and the second flat surface PLT2. The first flat surface PLT1 may overlap the first non-folding region NFA1. The first folding part PLF1 may overlap the folding region FA. The second flat surface PLT2 may overlap the second non-folding region NFA2.

The first flat surface PLT1, the first folding part PLF1 and the second flat surface PLT2 may be a flat surface defined by the first direction DR1 and the second direction DR2 in the unfolded state. A plurality of first openings OP1 may be defined in the first folding part PLF1. The first openings OP1 will be described in detail in FIG. 10.

The second support plate MTP2 may include a second stationary part LF2 and a second extendable part LE2.

The second stationary part LF2 may overlap the first stationary part LF1 and the stationary region DFP. The second extendable part LE2 may overlap the first extendable part LE1 and the extendable region DEP. The second extendable part LE2 may include a plurality of support bars MSB. The second support plate MTP2 will be described in detail with reference to FIGS. 12 to 16.

The second stationary part LF2 may include a third flat surface PLT3, a second folding part PLF2, and a fourth flat surface PLT4. The third flat surface PLT3, the second folding part PLF2, and the fourth flat surface PLT4 may be arranged in the direction opposite to the first direction DR1 in this order. The second folding part PLF2 may extend from the third flat surface PLT3 in the direction opposite to the first direction DR1. The fourth flat surface PLT4 may extend from the second folding part PLF2 in the direction opposite to the first direction DR1. The third flat surface PLT3, the second folding part PLF2, and the fourth flat surface PLT4 may be formed integrally. The second folding part PLF2 may be disposed between the third flat surface PLT3 and the fourth flat surface PLT4. The third flat surface PLT3 may overlap the first flat surface PLT1 and the first non-folding region NFA1. The second folding part PLF2 may overlap the first folding part PLF1 and the folding region FA. The fourth flat surface PLT4 may overlap the second non-folding region NFA2 and the second flat surface PLT2.

The third flat surface PLT3, the second folding part PLF2, and the fourth flat surface PLT4 may be a flat surface defined by the first direction DR1 and the second direction DR2 in the unfolded state. A plurality of second openings OP2 may be defined in the second folding part PLF2. The second openings OP2 will be described with reference to FIG. 13.

Figure 7:
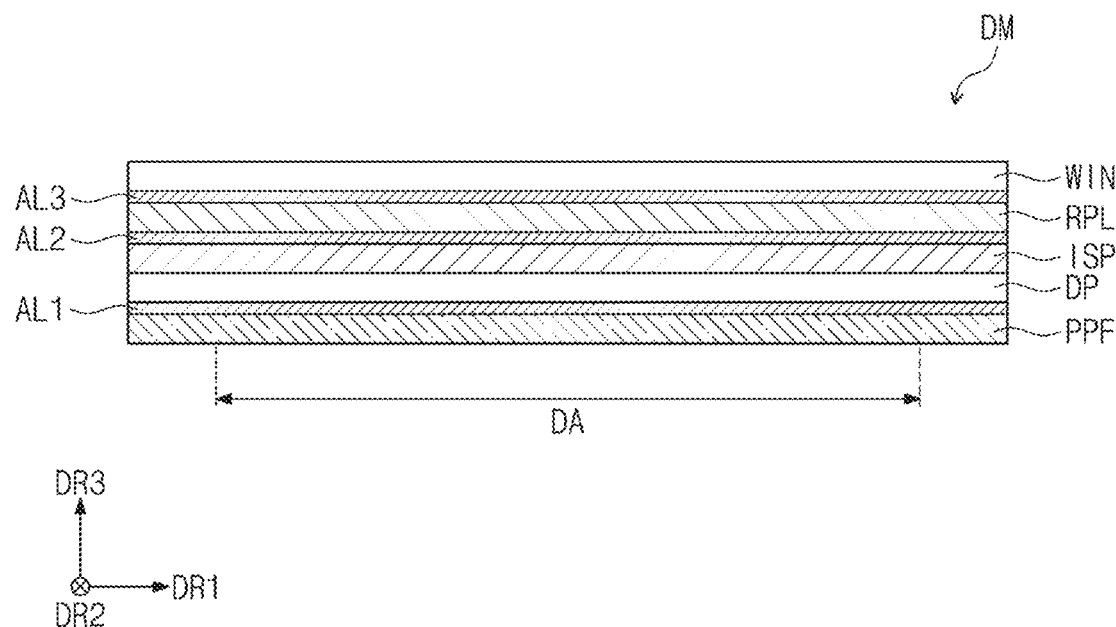
FIG. 7 exemplarily illustrates a cross-section of the display module illustrated in FIG. 6.

FIG. 7 exemplarily illustrates a cross-section of the display module illustrated in FIG. 6.

Referring to FIG. 7, the display module DM may include a display panel DP, an input sensing part ISP, an anti-reflection layer RPL, a window WIN, a panel protection film PPF, and a first to third adhesive layers AL1-AL3.

The display panel DP may be a flexible display panel. The display panel DP according to an embodiment of the invention may be a light-emitting display panel, but an embodiment of the invention is not limited thereto. For example, the display panel DP may be an organic light-emitting display panel or an inorganic light-emitting display panel. A light-emitting layer of the organic light-emitting display panel may include an organic light-emitting material. A light-emitting layer of the inorganic light-emitting display panel may include quantum dots, quantum rods, etc. Hereinafter, the display panel DP will be described as the organic light-emitting display panel.

The input sensing part ISP may be disposed on the display panel DP. The input sensing part ISP may include a plurality of sensing parts (not shown) for sensing an external input in a capacitive manner. When the display device DD is manufactured, the input sensing part ISP may be directly produced onto the display panel DP. However, an embodiment of the invention is not limited thereto, the input sensing part ISP may be manufactured as a separate panel from the display panel DP and attached to the display panel DP by an adhesive layer in another embodiment.

The anti-reflection layer RPL may be disposed on the input sensing part ISP. The anti-reflection layer RPL may be defined as an external light anti-reflection film. The anti-reflection layer RPL may reduce a reflectance of external light incident from above the display device DD toward the display panel DP.

If the external light proceeding toward the display panel DP is reflected from the display panel DP and provided back to a user outside, the user may view the external light as if the light were reflected from a mirror. To prevent such phenomenon, for example, the anti-reflection layer RPL may include a plurality of color filters that display same colors as pixels of the display panel DP.

The color filters may filter the external light into the same colors as the pixels. In this case, the external light may not be viewed by a user. However, an embodiment of the invention is not limited thereto, the anti-reflection layer RPL may include a phase retarder and/or a polarizer in order to reduce the reflectance of the external light in another embodiment.

The window WIN may be disposed on the anti-reflection layer RPL. The window WIN may protect the display panel DP, the input sensing part ISP, and the anti-reflection layer RPL from an external scratch and impact.

The panel protection film PPF may be disposed under the display panel DP. The panel protection film PPF may protect a lower surface of the display panel DP. The panel protection film PPF may include a flexible plastic material such as polyethylene terephthalate ("PET").

The first adhesive layer AL1 may be disposed between the display panel DP and the panel protection film PPF, and the display panel DP and the panel protection film PPF may be bonded together by the first adhesive layer AL1. The second adhesive layer AL2 may be disposed between the anti-reflection layer RPL and the input sensing part ISP, and the anti-reflection layer RPL and the input sensing part ISP may be bonded together by the second adhesive layer AL2. The third adhesive layer AL3 may be disposed between the window WIN and the anti-reflection layer RPL, and the window WIN and the anti-reflection layer RPL may be bonded together by the third adhesive layer AL3.

Figure 8:
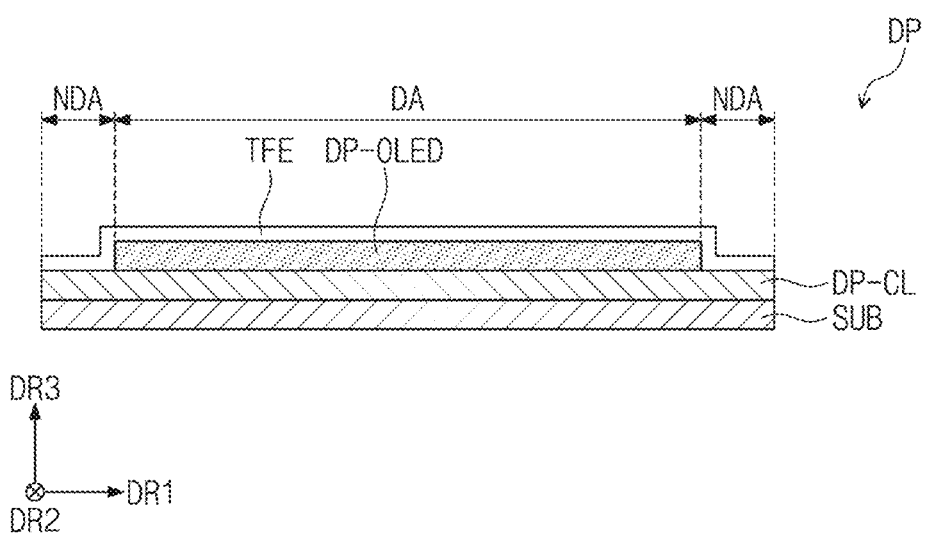
FIG. 8 exemplarily illustrates a cross-section of a display panel illustrated in FIG. 7.

FIG. 8 exemplarily illustrates a cross-section of the display panel illustrated in FIG. 7.

For example, the cross-section of the display panel DP seen from the second direction DR2 is illustrated in FIG. 8.

Referring to FIG. 8, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display region DA and a non-display region NDA around the display region DA. The substrate SUB may include a flexible plastic material such as polyimide ("PI"). The display element layer DP-OLED may be disposed on the display region DA.

A plurality of pixels may be disposed in the circuit element layer DP-CL and the display element layer DP-OLED. The pixels each may include transistors disposed in the circuit element layer DP-CL and a light-emitting element disposed in the display element layer DP-OLED and connected to the transistors. A configuration of the pixels will be described in detail below.

The thin-film encapsulation layer TFE may be disposed on the circuit element layer DP-CL so as to cover the display element layer DP-OLED. The thin-film encapsulation layer TFE may protect the pixels from moisture, air, and external dirt.

Figure 9:
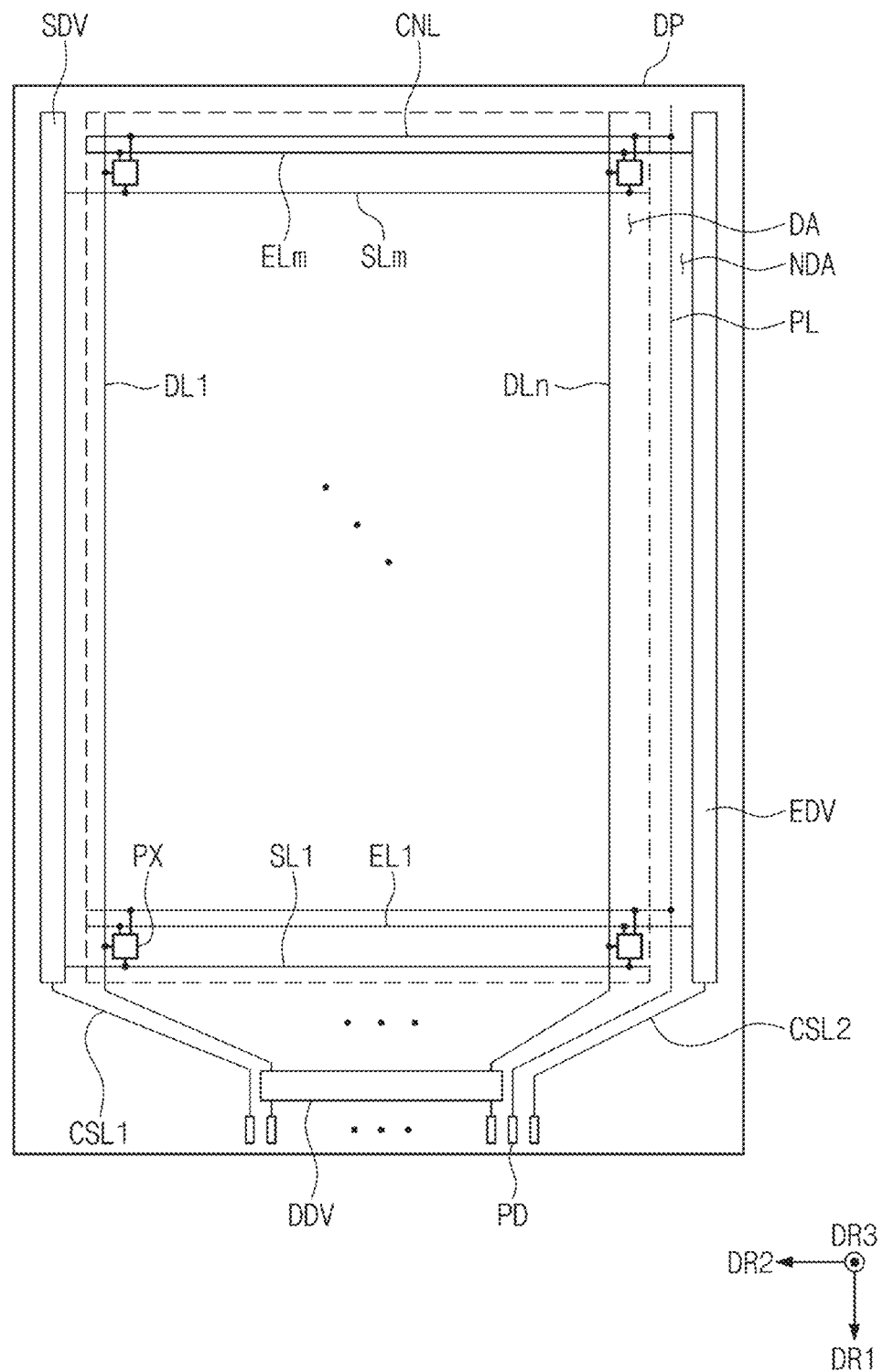
FIG. 9 is a plan view of a display panel illustrated in FIG. 8.

FIG. 9 is a plan view of the display panel illustrated in FIG. 8.

Referring to FIG. 9, the display panel DP may include a scan driver SDV, a data driver DDV, a light emission driver EDV, and a plurality of pads PD.

A shape of the display panel DP may be a rectangular shape having short sides extending in the first direction DR1 and long sides extending in the second direction DR2, but the shape of the display panel DP is not limited thereto. The display panel DP may include a display region DA and a non-display region NDA surrounding the display region DA.

The display panel DP may include a plurality of pixels PX, a plurality of scan lines SL1-SLm, a plurality of data lines DL1-DLn, a plurality of light emission lines EL1-ELm, a first and second control lines CSL1 and CSL2, a first and second power lines PL1 and PL2, and connection lines CNL. The m and n are natural numbers.

The pixels PX may be disposed in the display region DA. The scan driver SDV and the light emission driver EDV may be disposed in the non-display region NDA adjacent to the long sides of the display panel DP, respectively. The data driver DDV may be disposed in the non-display region NDA adjacent to one of the short sides of the display panel DP. In a plan view, the data driver DDV may be adjacent to a lower end of the display panel DP.

The scan lines SL1-SLm may extend in the second direction DR2 to be connected to the pixels PX and the scan driver SDV. The data lines DL1-DLn may extend in the first direction DR1 to be connected to the pixels PX and the data driver DDV. The light emission lines EL1-ELm may extend in the second direction DR2 to be connected to the pixels PX and the light emission driver EDV.

The power line PL may extend in the first direction DR1 to be disposed in the non-display region NDA. The power line PL may be disposed between the display region DA and the light emission driver EDV, but an embodiment of the invention is not limited thereto, the power line PL may be disposed between the display region DA and the scan driver SDV in another embodiment.

The connection lines CNL may extend in the second direction DR2 and be arranged in the first direction DR1 to be connected to the power line PL and the pixels PX. A driving voltage may be applied to the pixels PX via the power line PL and the connection lines CNL connected to each other.

The first control line CSL1 may be connected to the scan driver SDV, extending toward the lower end of the display panel DP. The second control line CSL2 may be connected to the light emission driver EDV, extending toward the lower end of the display panel DP. The data driver DDV may be disposed between the first control line CSL1 and the second control line CSL2.

The data lines DL1-DLn may be connected to the corresponding pads PD through the data driver DDV. In an embodiment, for example, the data lines DL1-DLn may be connected to the data driver DDV, and the data driver DDV may be connected to the pads PD corresponding to the data lines DL1-DLn, respectively.

Although not illustrated, the pads PD may be connected to a printed circuit board, and a timing controller and a voltage generation unit may be disposed on the printed circuit board. The timing controller may be manufactured as an integrated circuit chip and mounted on the printed circuit board. The timing controller and the voltage generation unit may be connected to the pads PD through the printed circuit board.

A scan control signal may be provided to the scan driver SDV via the first control line CSL1. A light emission control signal may be provided to the light emission driver EDV via the second control line CSL2. A data control signal may be provided to the data driver DDV. The timing controller may receive an image signal from outside and convert a data format of the image signal so as to be compatible with interface specifications of the data driver DDV, which may be provided to the data driver DDV.

The scan driver SDV may generate a plurality of scan signals in response to the scan control signal. The scan signals may be applied to the pixels PX via the scan lines SL1-SLm. The scan signals may be sequentially applied to the pixels PX.

In response to the data control signal, the data driver DDV may generate a plurality of data voltage corresponding to the image signal. The data voltage may be applied to the pixels PX via the data lines DL1-DLn. The light emission driver EDV may generate a plurality of light emission signals in response to the light emission control signal. The light emission signals may be applied to the pixels PX via the light emission lines EL1-ELm.

In response to the scan signals, the pixels PX may be provided with the data voltage. The pixels PX may display an image by emitting light with a luminance corresponding to the data voltage in response to the light emission signals. A light emission time of the pixels PX may be controlled by the light emission signals.

Figure 10:
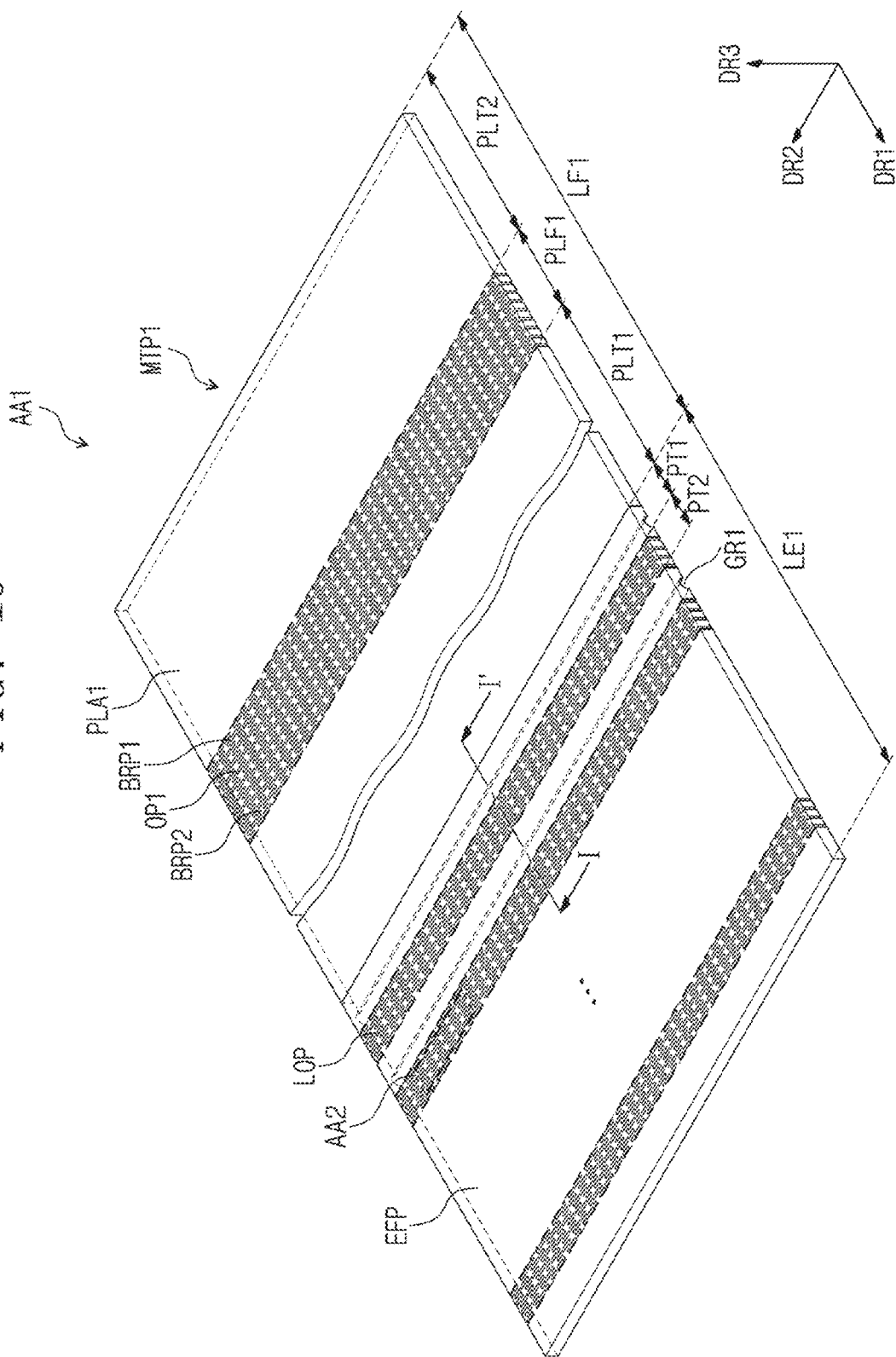
FIG. 10 is an enlarged view of an area AA1 illustrated in FIG. 6.
Figure 11:
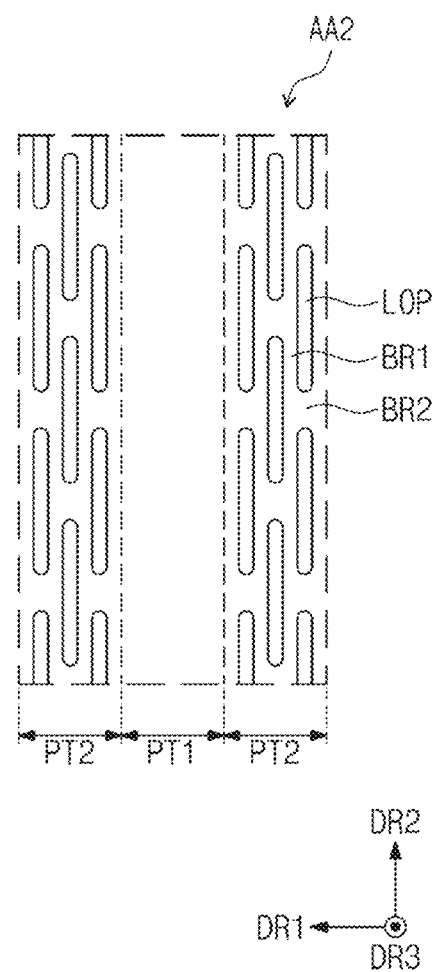
FIG. 11 is an enlarged view of an area AA2 illustrated in FIG. 10.
Figure 12:
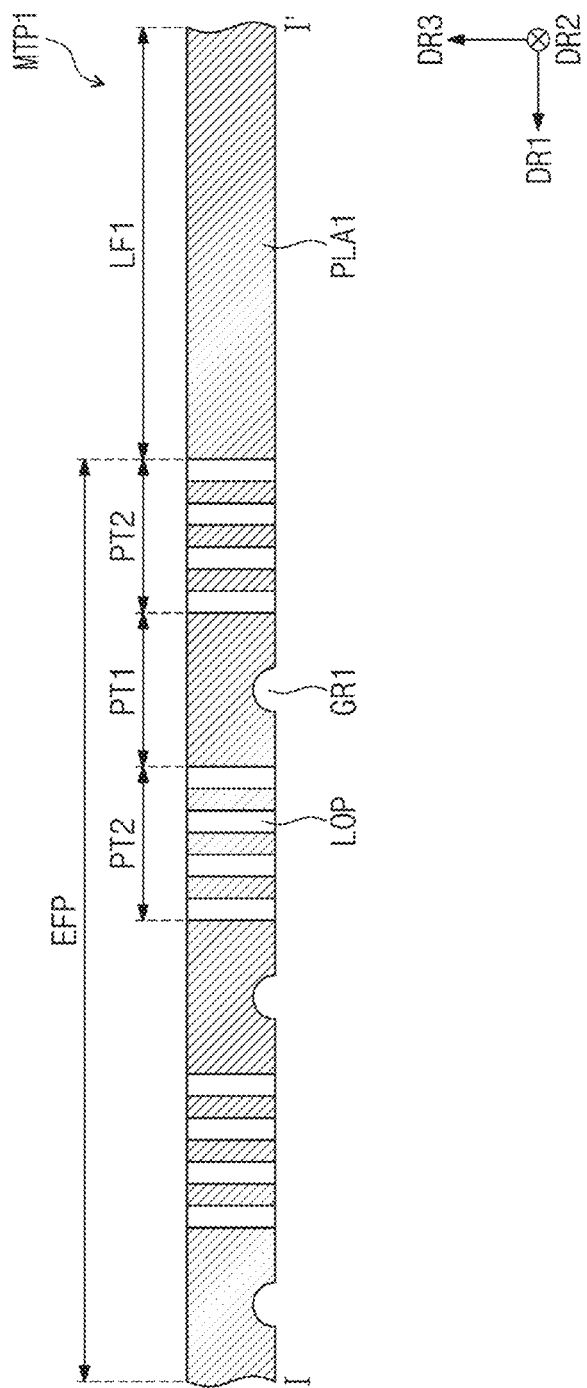
FIG. 12 is a cross-sectional view taken along line I-I' illustrated in FIG. 10.

FIG. 10 is an enlarged view of AA1 region illustrated in FIG. 6. FIG. 11 is an enlarged view of AA2 region illustrated in FIG. 10. FIG. 12 is a cross-sectional view taken along line I-I' illustrated in FIG. 10.

Referring to FIGS. 10, 11 and 12, a first support plate MTP1 may include a metal material (e.g., SUS 316 stainless steel) such as stainless metal, but the metal material of the first support plate MTP1 is not limited thereto. Furthermore, an embodiment of the invention is not limited thereto, the first support plate MTP1 may include a non-metal material such as plastic in another embodiment.

The first support plate MTP1 may include a first stationary part LF1 and a first extendable part LE1. The first extendable part LE1 may extend from the first stationary part LF1 in the first direction DR1. The first stationary part LF1 and the first extendable part LE1 may be arranged in the first direction DR1 in this order. Hereinafter, the first stationary part LF1 may be defined as a first flat part PLA1, and the first extendable part LE1 may be defined as a ductile part EFP.

The first flat part PLA1 may have a flat plate shape defined by the first direction DR1 and the second direction DR2. The first flat part PLA1 may have a first flat surface PLT1, a first folding part PLF1, and a second flat surface PLT2. The first flat surface PLT1, the first folding part PLF1, and the second flat surface PLT2 may be arranged in the direction opposite to the first direction DR1 in this order.

The first openings OP1 may be defined in the first folding part PLF1. The first openings OP1 may be arranged in a predetermined order. The first openings OP1 may be arranged in a grid pattern, forming the grid pattern in the first folding part PLF1.

As a greater number of the first openings OP1 are defined in the first folding part PLF1, an area of the first folding part PLF1 may be reduced and a rigidity of the first folding part PLF1 may decrease. Therefore, when the first openings OP1 are defined in the first folding part PLF1, a ductility of the first folding part PLF1 may become greater than when the first openings OP1 are not defined therein. As a result, the first folding part PLF1 may be more readily folded.

The first folding part PLF1 may include first regions BRP1 and second regions BRP2. The first regions BRP1 may be disposed between the first openings OP1 adjacent to each other in the first direction DR1. The second regions BR2 may be disposed between the first openings OP1 adjacent to each other in the second direction DR2.

The ductile part EFP may include a plurality of first parts PT1 and a plurality of second parts PT2. The first parts PT1 and the second parts PT2 may each extend in the second direction DR2 and may be alternately arranged repeatedly in the first direction DR1.

A plurality of first grooves GR1 may be defined in lower surfaces of the first parts PT1. The first grooves GR1 may be recessed from the lower surfaces of the first parts PT1 toward upper surfaces in the third direction DR3. The first grooves GR1 may be defined to extend up to opposite side surfaces of the first parts PT1 in the second direction DR2.

In an embodiment, for example, when seen from the second direction DR2, the first grooves GR1 may have a shape corresponding to a part of a circle, but an embodiment of the invention is not limited thereto, and the first grooves GR1 may have a shape corresponding to a part of a tetragon or a part of a triangle in another embodiment. Such shapes of the first grooves GR1 will be illustrated in FIGS. 20A and 20B below. In FIGS. 10 and 12, a case that each first part PT1 defines one first groove GR1 therein, but an embodiment of the invention is not limited thereto, and each first part PT1 may define a plural number of first grooves GR1 therein in another embodiment.

Referring to FIGS. 10 and 11, the second parts PT2 may be disposed between the first parts PT1 adjacent to each other. A plurality of openings LOP may be defined in the second parts PT2. The openings LOP may not be defined in the first parts PT1.

In a plan view, the openings LOP may be arranged in the first direction DR1 and the second direction DR2. The openings LOP may extend further in the second direction DR2 than in the first direction DR1. Openings LOP disposed in an h-th column and openings LOP disposed in a h+1-th column are alternately disposed in a staggered manner. The columns may correspond to the second direction DR2. The h is a natural number.

The second parts PT2 may include first branch parts BR1 and second branch parts BR2. The first branch parts BR1 may be disposed between the openings LOP adjacent to each other in the first direction DR1. The second branch parts BR2 may be disposed between the openings LOP adjacent to each other in the second direction DR2. The first branch parts BR1 may extend in the second direction DR2, and the second branch parts BR2 may extend in the first direction DR1. The openings LOP may be defined by the first and second branch parts BR1, BR2.

As a greater number of the openings LOP are defined, a rigidity of the ductile part EFP may decrease. Therefore, when the openings LOP are defined in the first support plate MTP1, a ductility of the first support plate MTP1 may become greater than when the openings LOP are not defined therein. As a result, the first support plate MTP1 may be more readily folded. As illustrated in FIG. 4, a part of the ductile part EFP may be readily folded and accommodated in the second case CS2.

Figure 13:
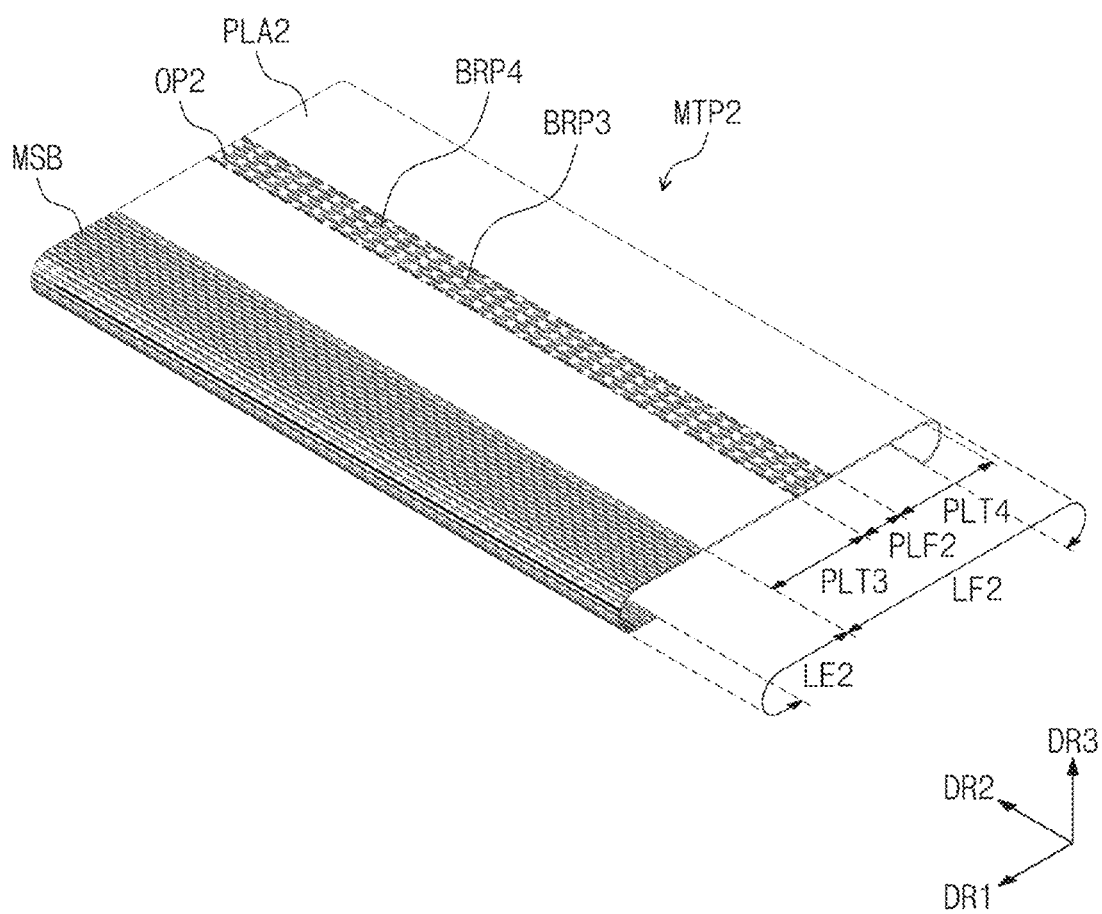
FIG. 13 is a perspective view of a second support plate illustrated in FIG. 4.
Figure 14:
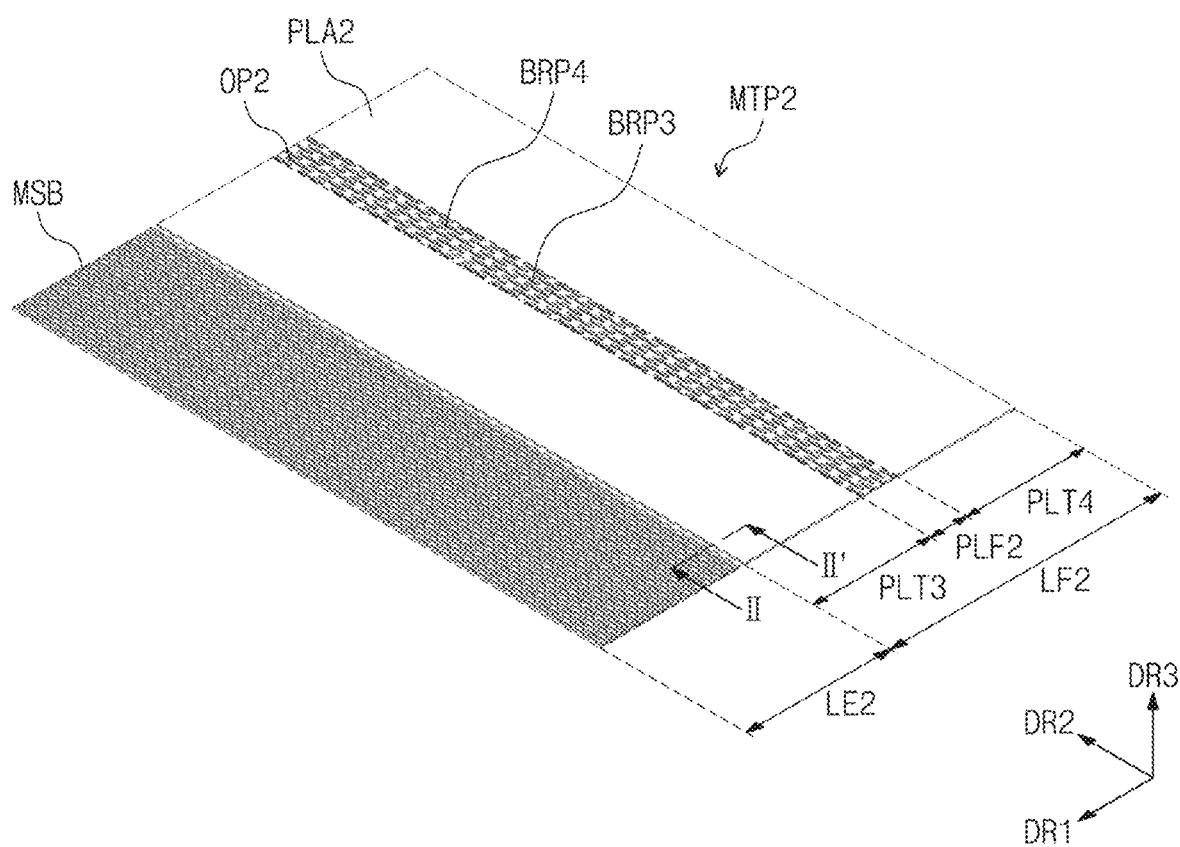
FIG. 14 is a perspective view illustrating that the second support plate illustrated in FIG. 13 is unfolded.
Figure 15:
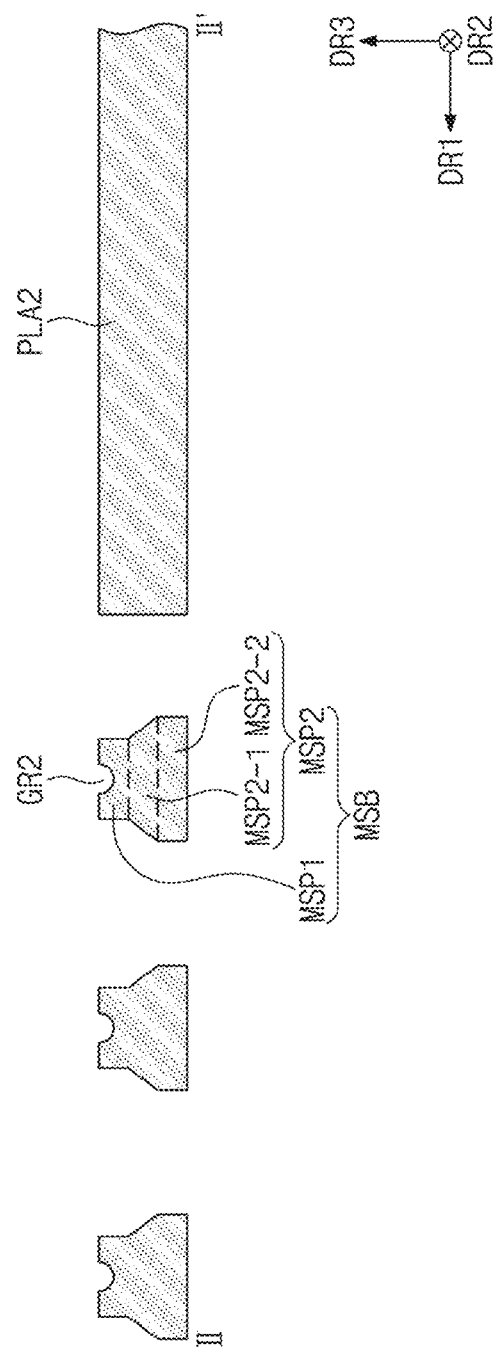
FIG. 15 is a cross-sectional view taken along a line II-II' of FIG. 14.
Figure 16:
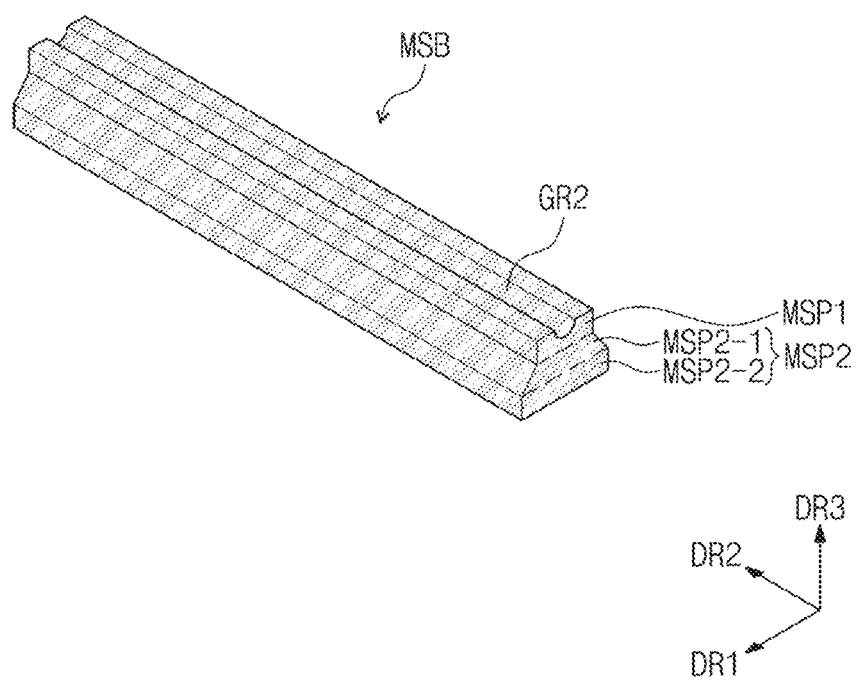
FIG. 16 is a perspective view of one of support bars illustrated in FIG. 12.

FIG. 13 is a perspective view of the second support plate illustrated in FIG. 4. FIG. 14 is a perspective view illustrating that the second support plate illustrated in FIG. 13 is unfolded. FIG. 15 is a cross-sectional view taken along line II-II' of FIG. 14. FIG. 16 is a perspective view of one of the support bars illustrated in FIG. 13.

Referring to FIGS. 13, 14, and 15, the second support plate MTP2 may include a metal material (e.g., SUS 316 stainless steel) such as stainless steel, but a material of the second support plate MTP2 is not limited thereto. Furthermore, an embodiment of the invention is not limited thereto, the second support plate MTP2 may include a non-metal material such as plastic in another embodiment.

The second support plate MTP2 may include a second stationary part LF2 and a second extendable part LE2. The second stationary part LF2 and the second extendable part LE2 may be arranged in the first direction DR1 in this order. When the second stationary part LF2 is unfolded, it may have a flat plate shape defined by the first direction DR1 and the second direction DR2. Hereinafter, the second stationary part LF2 may be defined as a second flat part PLA2.

The second flat part PLA2 may include a third flat surface PLT3, a second folding part PLF2, and a fourth flat surface PLT4. The third flat surface PLT3, the second folding part PLF2, and the fourth flat surface PLT4 may be arranged in the direction opposite to the first direction DR1 in this order.

As a greater number of the second openings OP2 are defined in the second folding part PLF2, an area of the second folding part PLF2 may be reduced and a rigidity of the second folding part PLF2 may decrease. Therefore, when the second openings OP2 are defined in the second folding part PLF2, a ductility of the second folding part PLF2 may become higher than when the second openings OP2 are not defined therein. As a result, the second folding part PLF2 may be more readily folded.

The second folding part PLF2 may include third regions BRP3 and fourth regions BRP4. The third regions BRP3 may be disposed between the second openings OP2 adjacent to each other in the first direction DR1. The fourth regions BR4 may be disposed between the second openings OP2 adjacent to each other in the second direction DR2.

The second extendable part LE2 may include a plurality of support bars MSB. The second flat part PLA2 and the support bars MSB may be arranged in the first direction DR1 in this order. The support bars MSB may extend in the second direction DR2 and may be spaced apart from each other and arranged in the first direction DR1.

Referring to FIGS. 15 and 16, each of the support bars MSB may include a first support part MSP1 and a second support part MSP2. The first support part MSP1 may be adjacent to the first support plate MTP1, as illustrated in FIGS. 4, 5A and 5B. Second grooves GR2 may be defined in each upper surface of the first support part MSP1. The second grooves GR2 may be defined to extend in the second direction DR2 up to opposite side surfaces of the support bars MSB, which are opposed to each other in the second direction DR2.

When seen from the second direction DR2, for example, the second grooves GR2 may have a shape corresponding to a part of a circle, but an embodiment of the invention is not limited thereto, and the second grooves GR2 may have a shape corresponding to a part of a tetragon, or a part of a triangle in another embodiment. Such shapes of the second grooves GR2 will be illustrated in FIGS. 20A and 20B below.

The second support part MSP2 may be disposed under the first support part MSP1. The second support part MSP2 may extend downward from the first support part MSP1 and may be formed with the first support part MSP1 integrally. A maximum width of the second support part MSP2 in the first direction DR1 may be greater than a width of the first support part MSP1 in the first direction DR1. The second support part MSP2 may include a 2-1-th support part MSP2-1 and a 2-2-th support part MSP2-2 extending downward from the 2-1-th support part MSP2-1. In an embodiment, for example, in the first direction DR1, a width of the 2-1-th support part MSP2-1 may increase downward from the first support part MSP1. In the first direction DR1, a width of the 2-2-th support part MSP2-2 may be uniform and the maximum width of the second support part MSP2. However, a shape of the support bars MSB are not limited thereto and may be various shapes such as a tetragon and a trapezium.

Figure 17:
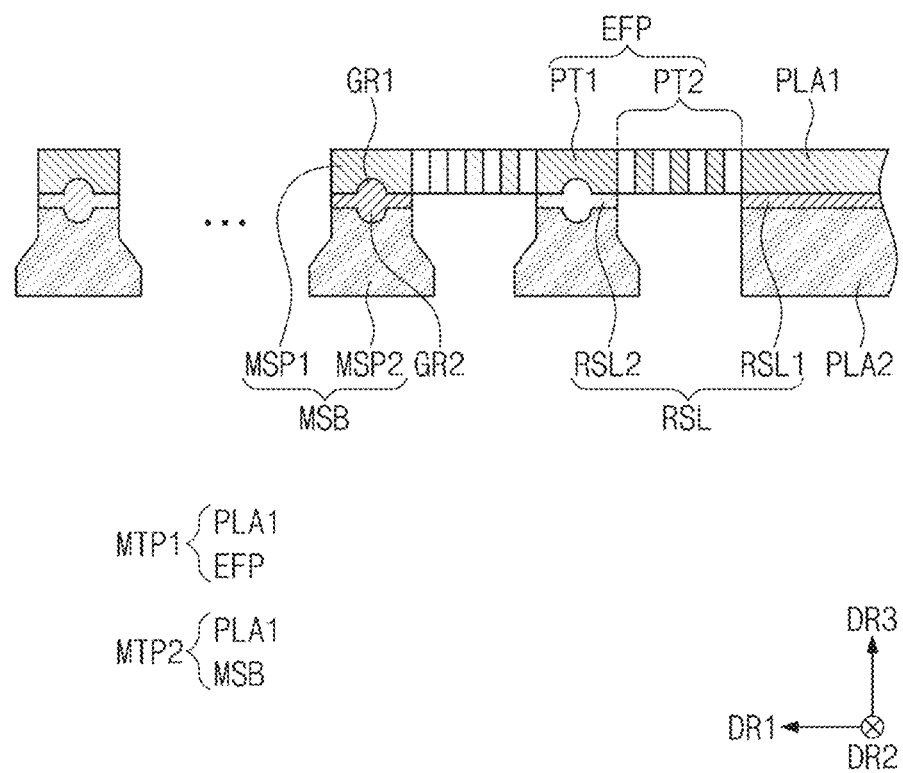
FIG. 17 is a view for describing a bonding relationship between a first support plate and the second support plate of FIG. 4.

FIG. 17 is a view for describing a bonding relationship between the first support plate and the second support plate.

For example, FIG. 17 is a side view of the first support plate MTP1 and the second support plate MTP2 illustrated in FIG. 4 seen from the second direction DR2.

A first flat part PLA1, a second flat part PLA2, first parts PT1, second parts PT2, support bars MSB, first grooves GR1, and second grooves GR2 are identical with the first flat part PLA1, the second flat part PLA2, the first parts PT1, the second parts PT2, the support bars MSB, the first grooves GR1, and the second grooves GR2 illustrated in FIGS. 10 to 16, and therefore, descriptions of the foregoing components will be omitted or provided briefly.

Referring to FIG. 17, a second support plate MTP2 may be disposed under a first support plate MTP1. A second flat part PLA2 may be disposed under a first flat part PLA1. The support bars MSB may be disposed under a ductile part EFP. The support bars MSB may be disposed to overlap the first parts PT1. Upper surfaces of the support bars MSB and lower surfaces of the first parts PT1 may be disposed to face each other. The first grooves GR1 may be defined in the lower surfaces of the first parts PT1 of the first support plate MTP1, which face the support bars MSB. The first grooves GR1 and the second grooves GR2 may face each other. In an embodiment, for example, the first grooves GR1 and the second grooves GR2 may have the same shape as each other and may be symmetric to each other with respect to a plane defined by the first and second directions DR1 and DR2 and disposed between the first grooves GR1 and the second grooves GR2.

Resin layers RSL may be disposed between the first support plate MTP1 and the second support plate MTP2. The resin layers RSL may be, for example, urethane or an acrylic adhesive. The first support plate MTP1 and the second support plate MTP2 may be bonded together by the resin layers RSL.

The resin layers RSL may include a first resin layer RSL1 and a plurality of second resin layers RSL2. The first resin layer RSL1 may be disposed between the first flat part PLA1 and the second flat part PLA2. The first flat part PLA1 and the second flat part PLA2 may be bonded together by the first resin layer RSL1.

The second resin layers RSL2 may be disposed between the support bars MSB and the ductile part EFP. The second resin layers RSL2 may be disposed between the support bars MSB and the first parts PT1. The second resin layers RSL2 may be disposed on the lower surfaces of the first parts PT1. The second resin layers RSL2 may fill the first grooves GR1. The second resin layers RSL2 may be disposed on the upper surfaces of the support bars MSB. The second resin layers RSL2 may fill the second grooves GR2 defined in the upper surfaces of the support bars MSB. The support bars MSB and the ductile part EFP may be bonded together by the second resin layers RSL2 filled in the first grooves GR1 and the second grooves GR2.

If an adhesive layer is disposed between support bars with flat upper surfaces and a ductile part with a flat lower surface, an adhesion of the adhesive layer may reduce as a display device repeats extension and contraction motions in a direction parallel to the flat upper surfaces and the flat lower surface. In this case, the support bars MSB may become apart from the ductile part EFP.

In an embodiment of the invention, by first grooves GR1 defined in lower surfaces of first parts PT1 of a ductile part EFP and second grooves GR2 defined in upper surfaces of support bars MSB, an adhesion area of second resin layers RSL2 to the support bars MSB and an adhesion area of the second resin layers RSL2 to the first parts PT1 may increase. Since adhesion may be proportionate to an adhesion area, an adhesion of the second resin layers RSL2 to the support bars MSB and an adhesion of the second resin layers RSL2 to the first parts PT1 may increase. Therefore, an adhesion between the support bars MSB and the ductile part EFP increases due to the second resin layers RSL2, and the support bars MSB may not be separated from the ductile part EFP even in the repeated extension and contraction motions of the display device in the direction parallel to the flat upper surfaces and the flat lower surface.

FIGS. 18A to 18G are views for describing a bond between support bars and first parts according to an embodiment of the invention.

For example, FIGS. 18A, 18B, 18C, 18F are perspective views. FIGS. 18D, 18E, and 18G are side views.

For ease of explanation, a first flat part PLA1 and a second flat part PLA2 are omitted from FIGS. 18A to 18F.

Support bars MSB, first parts PT1, second parts PT2, a first resin layer RSL1 and second resin layers RSL2 illustrated in FIGS. 18A to 18G are identical with the supporting bars MSB, the first parts PT1, the second parts PT2, and the resin layers RSL illustrated in FIGS. 10 to 17, and therefore, descriptions of the foregoing components will be omitted or provided briefly.

Figure 18A:
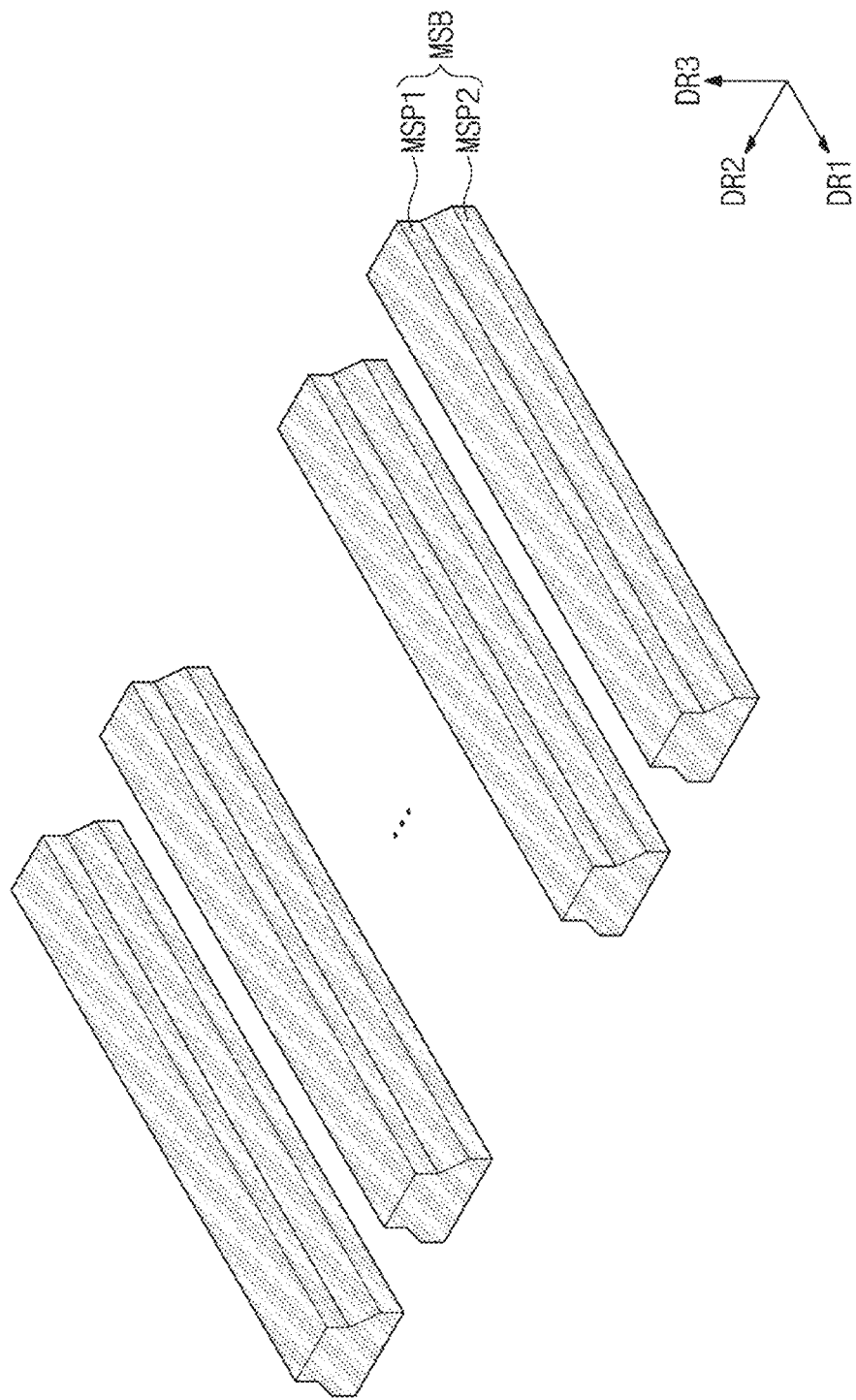
FIGS. 18A to 18G are views for describing a method for bonding the support bars and a first part according to an embodiment of the invention.
Figure 18B:
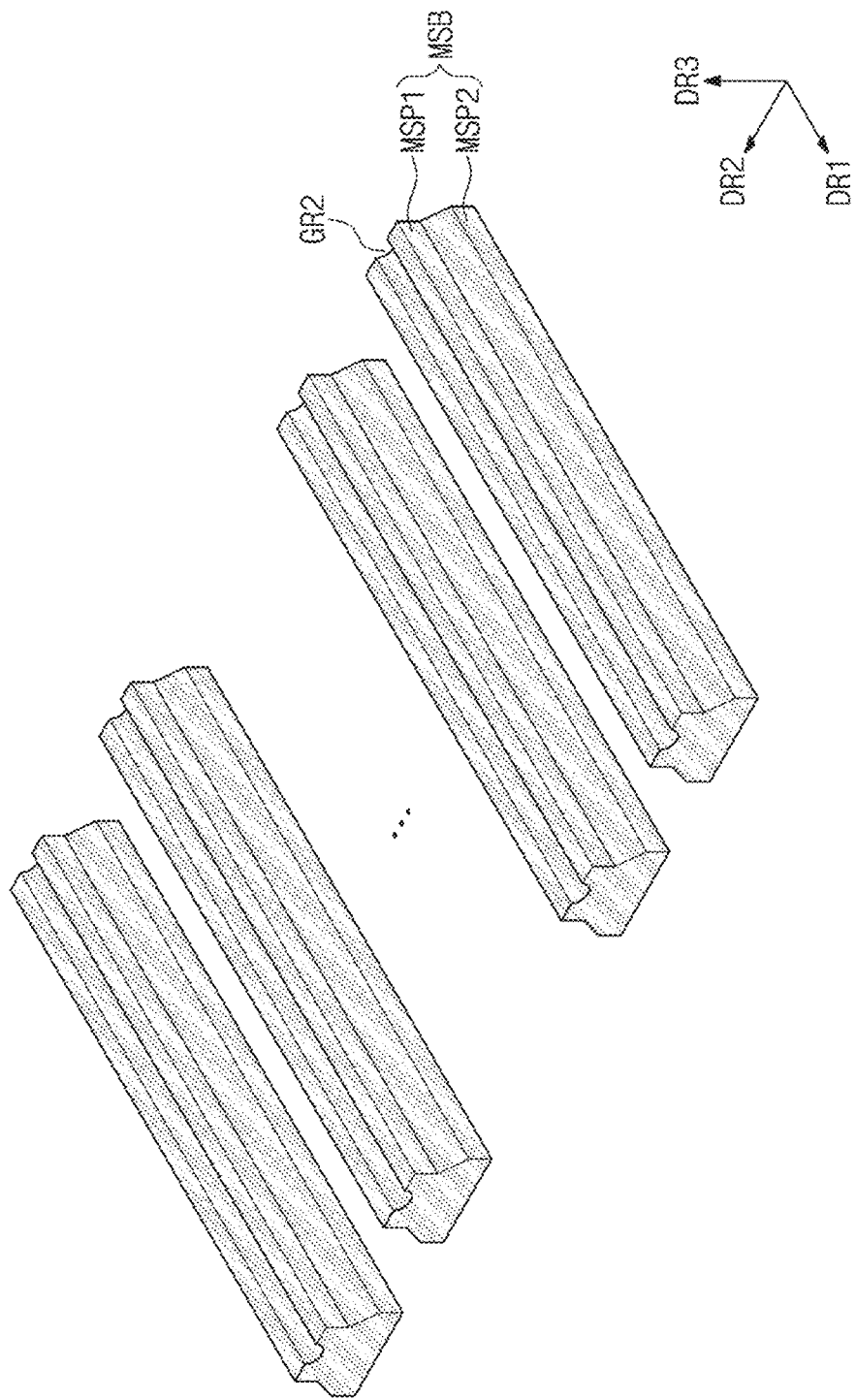

Referring to FIGS. 18A and 18B, the support bars MSB may be arranged in the second direction DR2. On upper surfaces of the support bars MSB, second grooves GR2 extending in the first direction DR1 may be defined. The second grooves GR2 may be defined by eliminating a part of the upper surfaces of the support bars MSB through wet etching using developer.

Figure 18C:
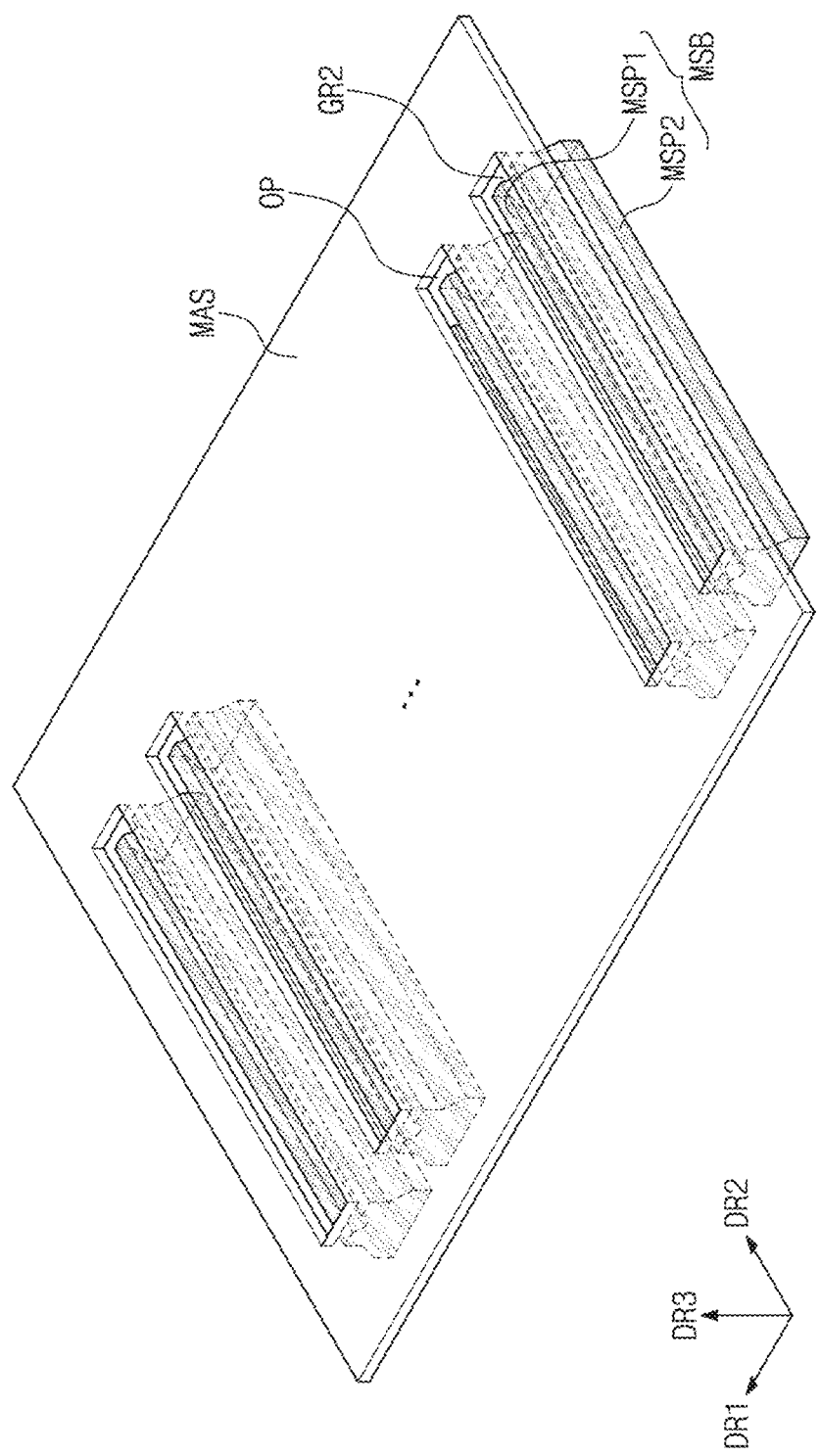
Figure 18D:
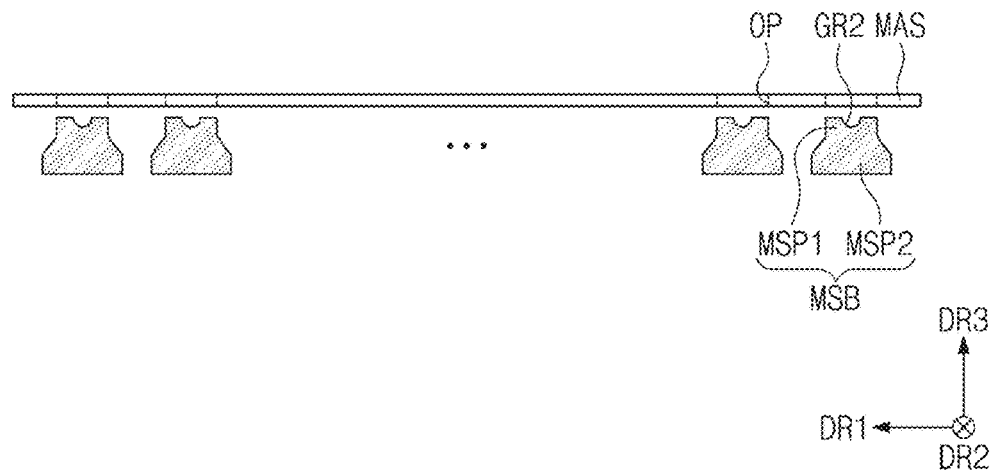
Figure 18E:
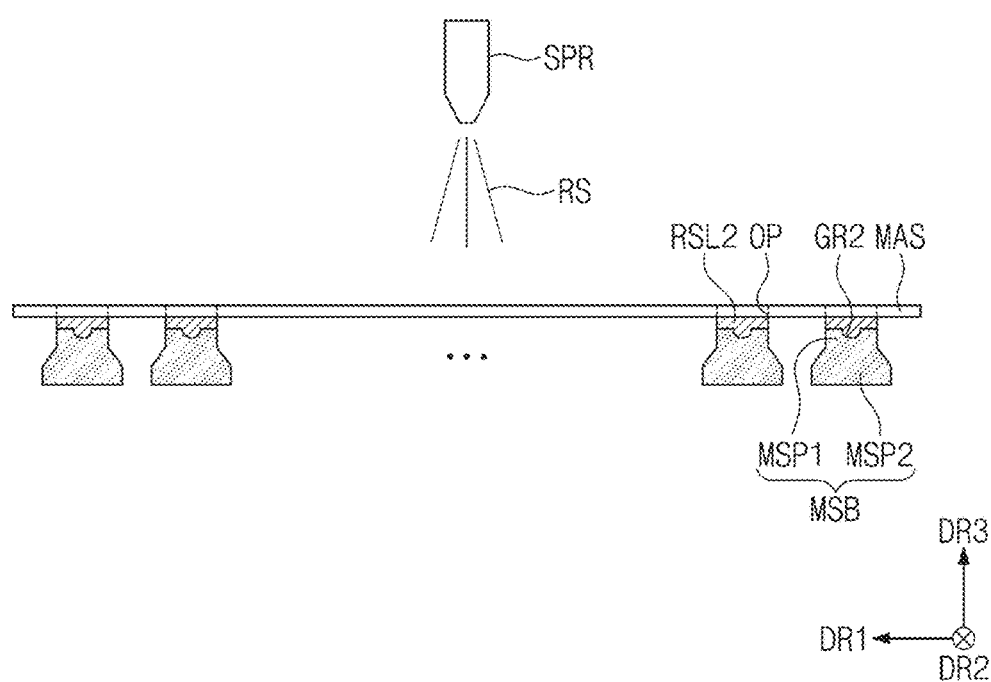

Referring to FIGS. 18C and 18D, a mask MAS may be disposed on the support bars MSB. The mask MAS may be disposed to be spaced apart from the support bars MSB.

A shape of the mask MAS may be flat defined by the first direction DR1 and the second direction DR2. A plurality of opening patterns OP may be defined in the mask MAS. The opening patterns OP may extend in the second direction DR2 and may be arranged in the first direction DR1. The openings patterns OP may overlap the support bars MSB.

Referring to FIG. 18E, a sprayer SPR may be disposed above the support bars MSB and the mask MAS. The sprayer SPR may provide resin RS onto the support bars MSB and the mask MAS. The resin RS may pass through the opening patterns OP and may be provided onto an upper surface of the first support part MSP1 and into the second grooves GR2. The resin provided onto the upper surface of the first support part MSP1 and into the second grooves GR2 may be defined as second resin layers RSL2.

Figure 18F:
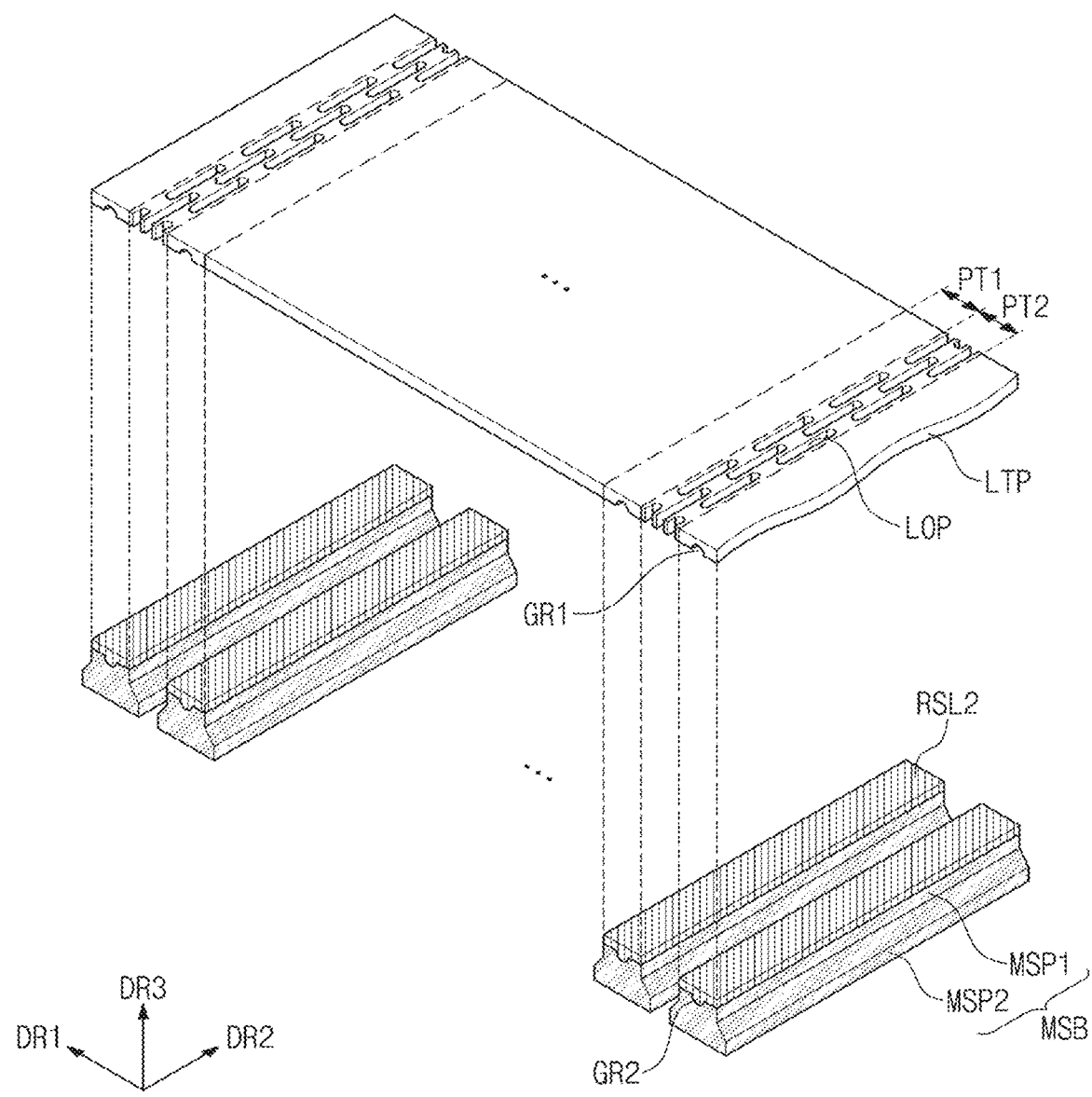
Figure 18G:
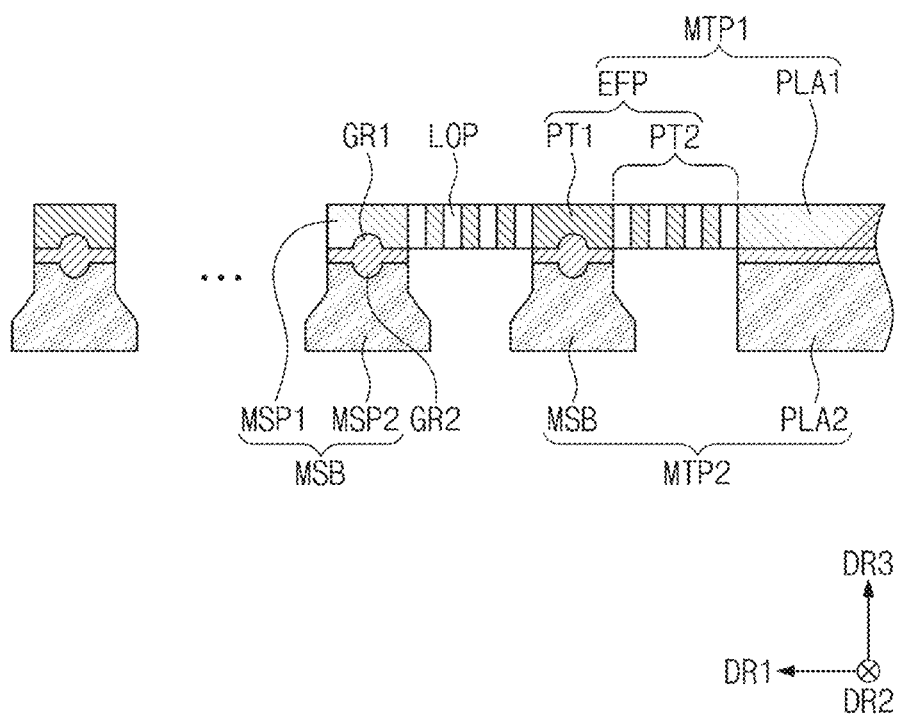

Referring to FIGS. 18F and 18G, the mask MAS may be removed, and then, first parts PT1 and second parts PT2 may be disposed on the support bars MSB. Although not illustrated, the first grooves GR1 may be defined in lower surfaces of the first parts PT1 by wet etching using developer.

The first parts PT1 may be aligned to face the support bars MSB. The first grooves GR1 may face the second grooves GR2 in the third direction DR3. If the first parts PT1 are aligned to face the support bars MSB, the first parts PT1 may move toward the support bars MSB in the third direction DR3 and may be disposed on the second resin layers RSL2. The second resin layers RSL2 may fill the first grooves GR1. By the second resin layers RSL2, the support bars MSB and the first parts PT1 may be bonded together.

A first flat part PLA1 may be disposed on a second flat part PLA2. A first resin layer RSL1 may be disposed between the first flat part PLA1 and the second flat part PLA2. By the first resin layer RSL1, the first flat part PLA1 and the second flat part PLA2 may be bonded together.

Figure 19:
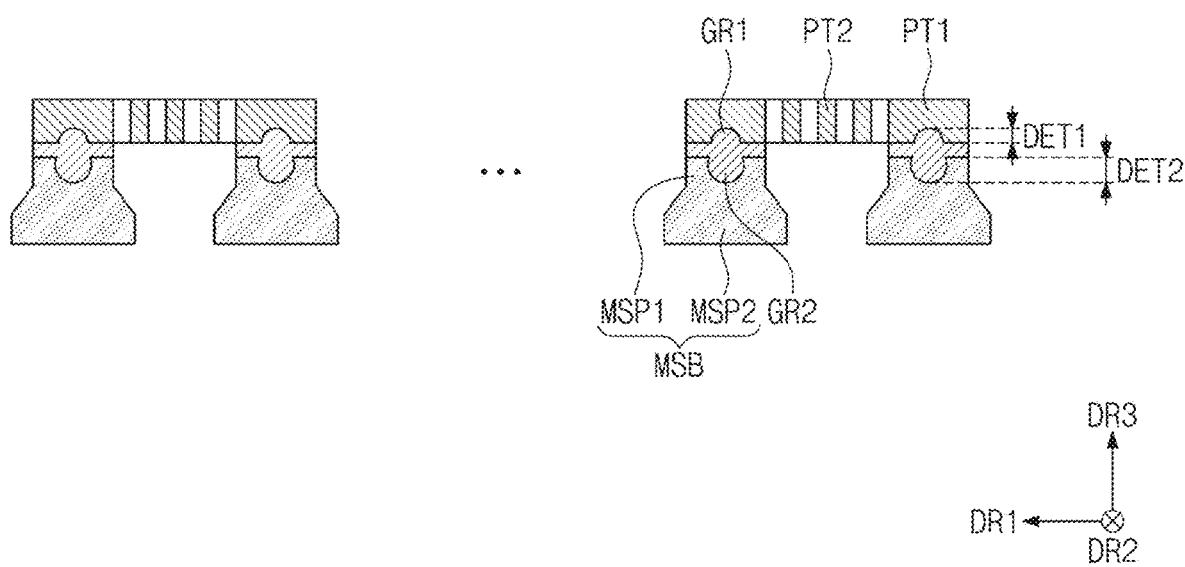
FIG. 19 is a side view illustrating support bars and a ductile part according to another embodiment of the invention.

FIG. 19 is a side view of support bars and a ductile part according to another embodiment of the invention.

For example, FIG. 19 illustrates the support bars MSB and the ductile part EFP seen from the second direction DR2.

In an embodiment, for example, a first flat part PLA1 and a second flat part PLA2 are omitted for ease of explanation.

Since the support bars MSB, first parts PT1, and second parts PT2 illustrated in FIG. 19 are identical, descriptions of the foregoing components will be omitted or provided briefly.

Referring to FIG. 19, a first depth DET1 of first grooves GR1 and a second depth DET2 of second grooves GR2 may be different from each other. Hereinafter, the first depth DET1 may be defined as a maximum depth of the first grooves GR1 recessed toward an upper surface of the ductile part EFP with respect to a lower surface thereof. The second depth DET2 may be defined as a maximum depth of the second grooves GR2 recessed toward a lower surface of the support bars MSB with respect to an upper surface thereof.

The first depth DET1, for example, may be smaller than the second depth DET2, but an embodiment of the invention is not limited thereto, and the first depth DET1 may be greater than the second depth DET2 in another embodiment. In this case, the first grooves GR1 and the second grooves GR2 may not be symmetric to each other with respect to a plane defined by the first and second directions DR1 and DR2 and disposed between the first grooves GR1 and the second grooves GR2.

Figure 20A:
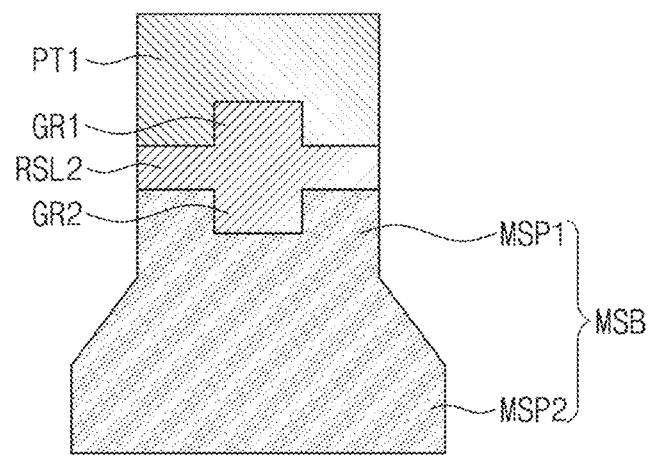
FIGS. 20A and 20B are side views illustrating support bars and a ductile part according to another embodiment of the invention.
Figure 20B:
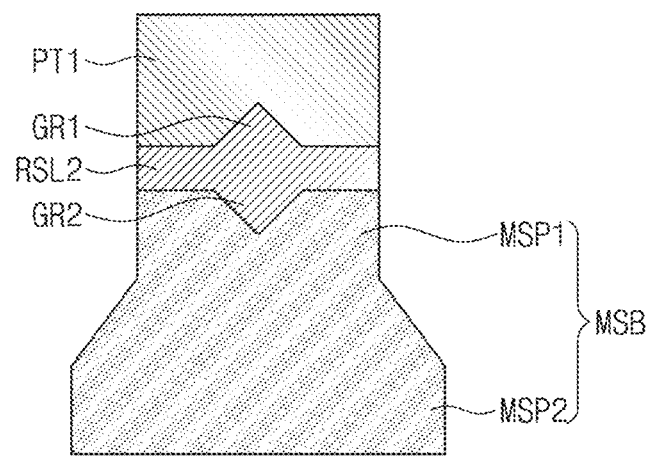

FIGS. 20A and 20B are side views of support bars and a ductile part according to another embodiment of the invention.

For example, FIGS. 20A and 20B show the support bars MSB and the first part PT1 seen from the second direction DR2.

For ease of explanation, second parts PT2, a first flat part PLA1 and a second flat part PLA2 are omitted, and, amongst a plurality of first parts PT1 and the support bars MSB, one flat part PT1 and one support bar MSB are illustrated.

The support bars MSB, the first parts PT1, and second parts PT2 illustrated in FIGS. 20A and 20B are identical with the support bars MSB, the first parts PT1, and the second parts PT2 illustrated in FIGS. 10 to 17, and therefore, it will be omitted or abbreviated to explain.

Referring to FIG. 20A, a first groove GR1 and a second groove GR2 may have a shape corresponding to a part of a tetragon. The first groove GR1 and the second groove GR2 may be symmetric to each other with respect to the third direction DR3.

Referring to FIG. 20B, the first groove GR1 and the second groove GR2 may have a shape corresponding to a part of a triangle. The first groove GR1 and the second groove GR2 may be symmetric to each other in the third direction DR3.

Referring to FIG. 20B, the first groove GR1 and the second groove GR2 may have a shape corresponding to a part of a triangle. The first groove GR1 and the second groove GR2 may be symmetric to each other with respect to the third direction DR3.

Figure 21A:
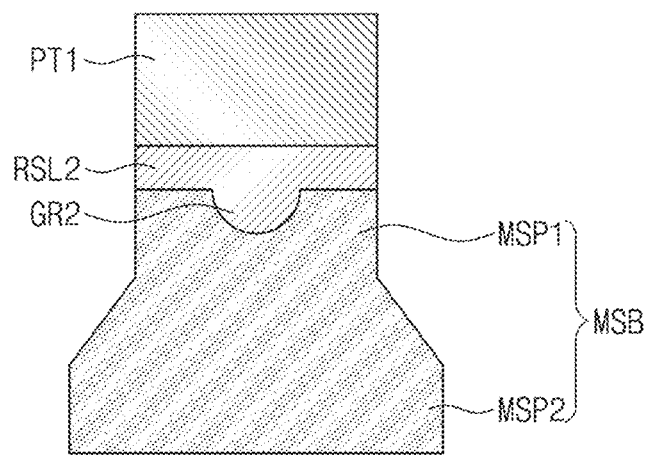
FIGS. 21A to 21C are side views illustrating support bars and a ductile part according to another embodiment of the invention.
Figure 21B:
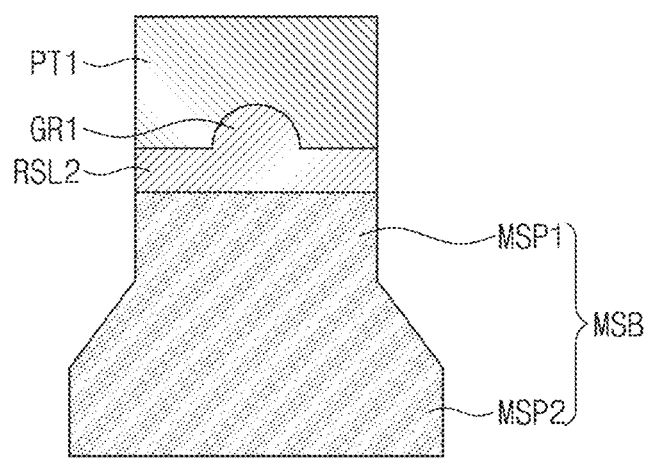
Figure 21C:
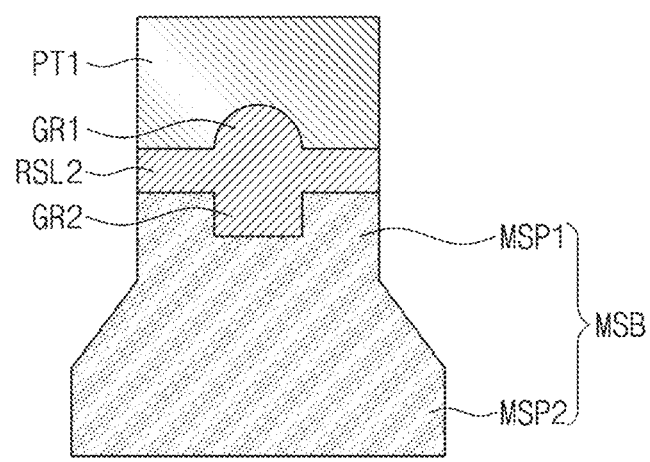

FIGS. 21A to 21C are side views of support bars and a ductile part according to another embodiment of the invention.

For example, FIGS. 21A to 21C illustrate the support bars MSB and the ductile part EFP seen from the second direction DR2.

For example, for ease of explanation, second parts PT2, a first flat part PLA1 and a second flat part PLA2 are omitted, and, amongst a plurality of first parts PT1 and the support bars MSB, one first part PT1 and one support bar MSB are illustrated.

The support bars MSB, the first parts PT1, and second parts PT2 illustrated in FIGS. 21A to 21C are identical with the support bars MSB, the first parts PT1, and the second parts PT2 illustrated in FIGS. 9 to 17, and therefore, descriptions of the foregoing components will be omitted or provided briefly.

Referring to FIG. 21A, a second groove GR2 may be defined in an upper surface of a first support part MSP1. Grooves may not be defined in a lower surface of the first part PT1. A second resin layer RSL2 disposed between the first part PT1 and the first support part MSP1 may fill the second groove GR2.

Referring to FIG. 21B, a first groove GR1 may be defined in a lower surface of the first part PT1. Grooves may not be defined in an upper surface of the first support part MSP1. A second resin layer RSL2 disposed between the first part PT1 and the first support part MSP1 may fill the first groove GR1.

Referring to FIG. 21C, the first groove GR1 may be defined in the lower surface of the first part PT1. The second groove GR2 may be defined in the upper surface of the first support part MSP1. The first groove GR1 may have a different shape from the second groove GR2. In an embodiment, for example, when seen from the second direction DR2, the first groove GR1 may have a shape corresponding to a part of a circle, and the second groove GR2 may have a shape corresponding to a part of a tetragon.

According to an embodiment of the invention, a plurality of grooves are defined each in a first support plate and a second support plate disposed under a display module, and a resin layer having an adhesive component may fill into the plurality of grooves. As the grooves are defined, adhesion areas of the resin layer to the first and the second support plates may increase, and the resin layer may not be separated from the first support plate and the second support plate. Accordingly, the first support plate and the second support plate may not be separated from each other.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:
1. A display device, comprising:
 a display module;
 a first support plate disposed under the display module, and including a first flat part and a ductile part, wherein the ductile part extends from the first flat part in a first direction and has a plurality of openings defined therein;
 a second support plate including a second flat part disposed under the first flat part and a plurality of support bars disposed under the ductile part and arranged in the first direction; and
 resin layers disposed between the first support plate and the second support plate,
 wherein a plurality of grooves are defined in a lower surface of the ductile part or upper surfaces of the support bars.

2. The display device of claim 1, wherein the grooves include:
 a plurality of first grooves defined in the lower surface of the ductile part; and
 a plurality of second grooves, each defined in each of the upper surfaces of the support bars.

3. The display device of claim 2, wherein the resin layers fill the first grooves and the second grooves.

4. The display device of claim 3, wherein the ductile part and the support bars are bonded together by the resin layers filled in the first grooves and the second grooves.

5. The display device of claim 2, wherein the first grooves and the second grooves have a same shape as each other and are disposed to be symmetric to each other.

6. The display device of claim 2, wherein the ductile part includes:
 a plurality of first parts overlapping the support bars; and
 a plurality of second parts disposed between the first parts, the first grooves being defined in lower surfaces of the first parts.

7. The display device of claim 6, wherein a plurality of openings are defined in the second parts, and are not defined in the first parts.

8. The display device of claim 7, wherein the plurality of openings are arranged in the first direction and a second direction crossing the first direction,
 openings disposed in an h-th column and openings disposed in a h+1-th column among the plurality of openings are alternately disposed in a staggered manner, the columns correspond to the second direction, and the h is a natural number.

9. The display device of claim 6, wherein the resin layers comprise:
   a first resin layer disposed between the first flat part and the second flat part; and
   a plurality of second resin layers disposed between the support bars and the first parts.

10. The display device of claim 2, wherein each of the support bars comprises:
    a first support part adjacent to the ductile part; and
    a second support part extending downward from the first support part,
    the second support part has a maximum width greater than the first support part in the first direction, and
    the second grooves are defined in an upper surface of the first support part.

11. The display device of claim 2, wherein the first and the second grooves extend in a second direction crossing the first direction,
    and the first and the second grooves are defined to extend up to opposite side surfaces of the support bars opposed to each other in the second direction and up to opposite side surfaces of the ductile part opposed to each other in the second direction.

12. The display device of claim 2, wherein the first grooves are different in shape from the second grooves in a side view.

13. The display device of claim 2, wherein a first depth of each of the first grooves is different from a second depth of each of the second grooves.

14. The display device of claim 1, further comprising a first case and a second case which are configured to accommodate the display module and the first and the second support plates, and which are coupled to each other and to move in the first direction,
    wherein the ductile part is folded and accommodated in a part of the first case and the second case coupled to each other.

15. The display device of claim 1, wherein the grooves are defined in the each of the upper surfaces of the support bars.

16. The display device of claim 1, wherein the grooves are defined in the lower surface of the ductile part.

17. The display device of claim 1, wherein the first flat part includes:
    a first flat surface;
    a first folding part extending from the first flat surface in the first direction; and
    a second flat surface extending from the first folding part in the first direction,
    wherein a plurality of first openings are defined in the first folding part.

18. The display device of claim 17, wherein the second flat part comprises:
    a third flat surface;
    a second folding part extending from the third flat surface in the first direction; and
    a fourth flat surface extending from the second folding part in the first direction,
    wherein a plurality of second openings are defined in the second folding part.

19. The display device of claim 1, wherein the grooves each have a shape corresponding to a part of a circle, a part of a tetragon, or a part of a triangle.

20. A display device, comprising:
    a display module;
    a first support plate disposed under the display module;
    a second support plate disposed under the first support plate, and including a flat part and a plurality of support bars arranged from the flat part in a first direction; and
    a resin layer disposed between the first support plate and the second support plate,
    wherein a plurality of grooves are defined in upper surfaces of the support bars, and the resin layer fills the grooves.

21. The display device of claim 20, wherein the grooves are further defined in a lower surface of a portion of the first support plate that faces the support bars, and the resin layer further fills the grooves defined in the lower surface.

22. A display device, comprising:
    a display module;
    a first support plate disposed under the display module, and including a first flat part and a ductile part, wherein the ductile part extends from the first flat part and has a plurality of openings defined therein; and
    a second support plate including a second flat part disposed under the first flat part and a plurality of support bars disposed under the ductile part and arranged in a first direction;
    wherein a plurality of grooves are defined in a lower surface of the ductile part and upper surfaces of the support bars.

* * * * *